United States Patent [19]
Sato et al.

[11] Patent Number: 5,750,310
[45] Date of Patent: May 12, 1998

[54] POSITIVE PHOTORESIST COMPOSITION

[75] Inventors: Kenichiro Sato; Shinji Sakaguchi; Makoto Momota, all of Shizuoka, Japan

[73] Assignee: Fuji Photo Film Co., Ltd., Kanagawa, Japan

[21] Appl. No.: 636,408

[22] Filed: Apr. 23, 1996

[30] Foreign Application Priority Data

Apr. 27, 1995 [JP] Japan ................................ 7-104307
Jan. 18, 1996 [JP] Japan ................................ 8-006694

[51] Int. Cl.$^6$ ................................................ G03F 7/023
[52] U.S. Cl. ........................ 430/192; 430/165; 430/193
[58] Field of Search ........................ 430/165, 192, 430/193

[56] References Cited

U.S. PATENT DOCUMENTS

| | | | |
|---|---|---|---|
| 5,368,977 | 11/1994 | Yoda et al. | 430/192 |
| 5,407,778 | 4/1995 | Uetani et al. | 430/192 |
| 5,407,779 | 4/1995 | Uetani et al. | 430/192 |
| 5,413,895 | 5/1995 | Tomioka et al. | 430/192 |
| 5,529,881 | 6/1996 | Kawabe et al. | 430/192 |
| 5,541,033 | 7/1996 | Blakeney et al. | 430/192 |
| 5,554,481 | 9/1996 | Kawabe et al. | 430/192 |
| 5,565,300 | 10/1996 | Uenishi et al. | 430/192 |
| 5,609,982 | 3/1997 | Sato et al. | 430/192 |

FOREIGN PATENT DOCUMENTS 6167805  6/1994  Japan.

*Primary Examiner*—John S. Chu
*Attorney, Agent, or Firm*—Sughrue, Mion, Zinn, Macpeak & Seas, PLLC

[57] ABSTRACT

There are provided a positive photoresist composition comprising an alkali-soluble resin and a 1,2-naphthoquinonediazide-5-(and/or-4-) sulfonic ester of a tetrahydroxy compound having a specific structure, said ester component having a pattern area in the high-performance liquid chromatography determined using ultraviolet rays of 254 nm accounting for 50% or more of the entire pattern area and a positive photoresist composition comprising an alkali-soluble resin and 1,2-naphthoquinonediazide-5-(and/or -4-)sulfonic esters of two kinds of specific polyhydroxy compounds. The positive photoresist is suitable for ultrafine working and ensures high sensitivity and high resolution and is improved with respect to film thickness dependency and standing wave.

8 Claims; No Drawings

POSITIVE PHOTORESIST COMPOSITION

FIELD OF THE INVENTION

The present invention relates to a positive photoresist composition comprising an alkali-soluble resin and a specific 1,2-quinonediazide compound and sensitive to radiation rays such as ultraviolet ray, far infrared ray, X ray, electron beam, molecular beam, γ ray and synchrotron radiation. More specifically, the present invention relates to a positive photoresist for fine working capable of ensuring high resolution and high sensitivity independent of fluctuation in the film thickness and also providing good development latitude and a positive photoresist for ultrafine working capable of ensuring high resolution independent of fluctuation in the film thickness without causing any reduction in the sensitivity and further free of generation of standing wave.

BACKGROUND OF THE INVENTION

A positive photoresist is coated on a substrate such as semiconductor wafer, glass, ceramic or gold by a spin coating or roller coating method to have a thickness of from 0.5 to 2 μm. Thereafter, the coating is heated, dried and subjected to printing of a circuit pattern or the like through an exposure mask by ultraviolet ray irradiation, then to post exposure baking, if desired, and to development to form a positive image.

As the positive photoresist composition, a composition comprising an alkali-soluble resin binder such as novolak and a naphthoquinonediazide compound as a photosensitive material is commonly used.

The integrated circuit is more and more being intensified in the integration and in producing a semiconductor substrate for ultra LSI, the working required involves an ultrafine pattern comprising lines having a width of 0.5 μm or less. In this use, the photoresist is particularly demanded to have a wide development latitude so as to stably provide high resolution and always ensure a constant working line width. Further, in order to prevent the working failure of the circuit, the resist pattern after development must have no resist residue.

Also, particularly in forming an ultrafine pattern having a line width of 0.5 μm or less, it is found that even if a desired resolution can be obtained with a certain film thickness, slight change in the coated film thickness causes deteriorated resolution (this phenomenon is hereinafter referred to as "film thickness dependency"). Surprisingly, the resolution greatly varies only with a slight change in the film thickness of several percent μm and any of representative positive photoresists currently available on the market is known to have more or less such a tendency. More specifically, when the thickness of a resist film before exposure changes in the range of λ/4n (λ: exposure wavelength, n: refractive index of the resist film at the wavelength) to a predetermined film thickness, the resolution varies.

With respect to the film thickness dependency, for example, *SPIE Proceedings*, vol. 1925, page 626 (1993) points out the presence of the problem and states that this phenomenon is attributable to multiple reflection effect of light in the resist film.

It is found that in particular, when the contrast of the resist is intensified to obtain a high resolution pattern having a rectangular cross section, the film thickness dependency becomes large in many cases. In actual working for a semiconductor substrate, a pattern is formed using a resist film finely different in the coated thickness depending upon the coated site due to unevenness on the substrate surface or due to uneven coating. Accordingly, the above-described film thickness dependency is one of obstacles to fine working using a positive photoresist, where nearly limiting resolution of the resist is required.

JP-A-2-296349 (the term "JP-A" as used herein means an "unexamined published Japanese patent application") discloses a quinonediazidesulfonic ester form of a polyhydroxy compound having a specific structure represented by the following formula (A), however, the resist obtained therefrom is still insufficient in view of sensitivity, resolution and film thickness dependency.

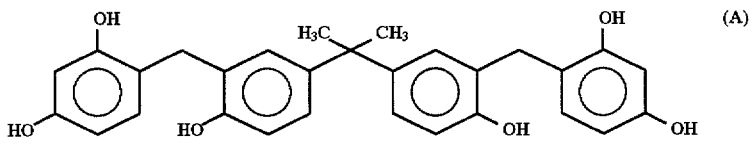

JP-A-6-167805 discloses a selectively esterified diester form of a quinonediazidesulfonic acid of a tetra- or pentafunctional polyhydroxy compound as an effective photosensitive material. However, when this photosensitive material only is used, the influence of multiple reflection at the time of exposure cannot be sufficiently controlled and as a result, standing wave is readily generated on the wall surface of the resist pattern. The standing wave is generally known to be improved by the baking but the standing wave encountered in the above-described technique could not be improved even by the baking.

SUMMARY OF THE INVENTION

As mentioned above, it has been thoroughly not known how to design the composition of the resist material so as to obtain high sensitivity, high resolution and improved film thickness dependency and so as to provide a resist having high resolution and improved film thickness dependency without causing any reduction in the sensitivity and also free of generation of standing wave.

Accordingly, an object of the present invention is to provide a positive photoresist composition for ultrafine working ensuring high sensitivity, high resolution and improved film layer dependency.

Another object of the present invention is to provide a positive photoresist composition for ultrafine working ensuring high resolution and improved film layer dependency without causing reduction in the sensitivity and also free of generation of standing wave.

The term "film thickness dependency" as used in the present invention means fluctuation in the resolution of a resist obtained after exposure (baking, if desired) and development, resulting from the change in the film thickness of the resist before exposure in the range of λ/4n.

As a result of extensive investigations taking notice of the above-described various properties, the present inventors have found that the above-described problem can be overcome by using a quinonediazidesulfonic ester of a polyhydroxy compound having a specific structure as a photosensitive material.

That is, the object of the present invention can be achieved by a positive photoresist composition comprising an alkali-soluble resin and a 1,2-naphthoquinonediazide-5-(and/or -4-)sulfonic ester of a polyhydroxy compound represented by the following formula ($I_i$), the tetraester component of the 1,2-naphthoquinonediazide-5-(and/or -4-)sulfonic ester of the polyhydroxy compound represented by formula ($I_i$) accounting for 50% or more of the entire pattern area determined by high-performance liquid chromatography using ultraviolet rays of 254 nm:

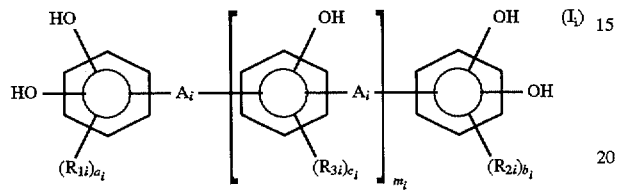

wherein $R_{1i}$, $R_{2i}$ and $R_{3i}$, which may be the same or different, each represents a hydrogen atom, a halogen atom, an alkyl group, a cycloalkyl group, an alkoxy group, an aryl group or an alkenyl group;

the $A_i$ groups, which may be the same or different, each represents a single bond, —O—, —S—, —SO—, —SO$_2$—, —CO—, —COO—,

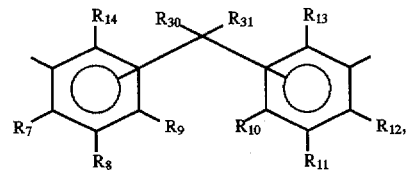

$R_{4i}$ and $R_{5i}$, which may be the same or different, each represents a hydrogen atom or an alkyl group, provided that $R_{4i}$ and $R_{5i}$ may be combined to form a ring;

$R_{6i}$, $R_{7i}$, $R_{8i}$, $R_{9i}$, $R_{10i}$ and $R_{11i}$, which may be the same or different, each represents a hydrogen atom or an alkyl group;

$a_i$, $b_i$ and $c_i$ each represents 0, 1, 2 or 3;

$m_i$ represents 2 or 3; and $n_i$ represents 1 or 2.

In the present invention, when a quinonediazidesulfonic ester of a polyhydroxy compound having the above-described specific structure is used as a photosensitive material, it exhibits improved film thickness dependency and provides high sensitivity and high resolution. The details thereon are not clarified but it is presumed that the above-described peculiar effects come out resulting from properly selecting the number and site of aromatic ring in the polyhydroxy compound, the number of hydroxyl group and the site of the hydroxyl group in the molecule.

Furthermore, the present inventors have found that the above-described problem can be overcome by using a quinonediazidesulfonic ester of a polyhydroxy compound represented by the following formula (I) in combination with a quinonediazidesulfonic ester of a polyhydroxy compound having a structure represented by the following formula (II) as a photosensitive material.

That is, the object of the present invention can be achieved by (1) a positive photoresist composition comprising an alkali-soluble resin, a 1,2-naphthoquinonediazide-5-(and/or -4-)sulfonic ester of a polyhydroxy compound represented by the following formula (I) and a 1,2-naphthoquinonediazide-5-(and/or -4-)sulfonic ester of a polyhydroxy compound represented by the following formula (II):

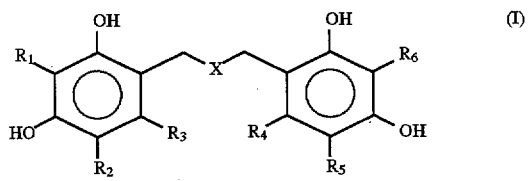

wherein X represents

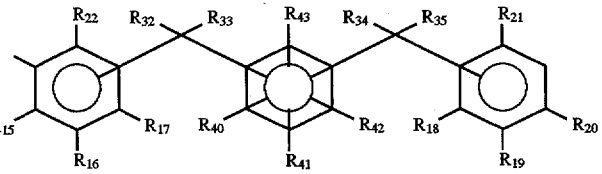

$R_1$ to $R_6$, which may be the same or different, each represents a hydrogen atom, a halogen atom, an alkyl group having from 1 to 4 carbon atoms or an alkenyl group having from 2 to 5 carbon atoms;

$R_7$ to $R_{22}$, which may be the same or different, each represents a hydrogen atom, a hydroxyl group, a halogen atom, an alkyl group having from 1 to 4 carbon atoms, an alkenyl group having from 2 to 5 carbon atoms or a cycloalkyl group;

$R_{30}$ to $R_{35}$, which may be the same or different, each represents a hydrogen atom or an alkyl group having from 1 to 4 carbon atoms (provided that $R_{30}$ and $R_{31}$, $R_{32}$ and $R_{33}$ or $R_{34}$ and $R_{35}$ may be combined with each other to form a methylene chain having 4 or 5 carbon atoms so that a 5- or 6-membered ring is formed by the methylene chain and the carbon atom to which the combined two groups are bonded);

$R_{40}$ and $R_{41}$, which may be the same or different, each represents a hydrogen atom, a halogen atom or an alkyl group having from 1 to 4 carbon atoms;

$R_{42}$ represents a hydrogen atom, a hydroxyl group or an alkyl group having from 1 to 4 carbon atoms; and $R_{43}$ represents a hydrogen atom, a halogen atom, an alkyl group having from 1 to 4 carbon atoms, an alkenyl group having from 2 to 5 carbon atoms, a cycloalkyl group, an aryl group or an alkoxy group;

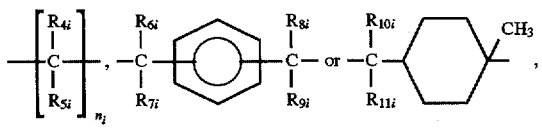

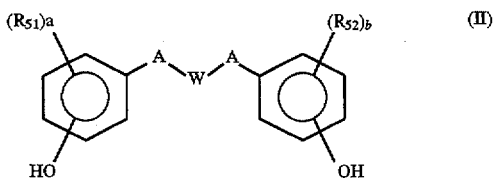

wherein $R_{51}$ and $R_{52}$, which may be the same or different, each represents a hydrogen atom, a halogen atom, an alkyl group, an alkenyl group, an aryl group, an alkoxy group, an acyl group or a cycloalkyl group;

a and b each independently represents an integer of from 0 to 3;

A represents $—C(R_{66})(R_{67})—$, $—O—$, $—S—$, $—C(O=)—$, $—C(=O)O—$, $—S(=O)—$ or $—S(=O)_2—$ (wherein $R_{66}$ and $R_{67}$, which may be the same or different, each represents a hydrogen atom or an alkyl group);

W represents

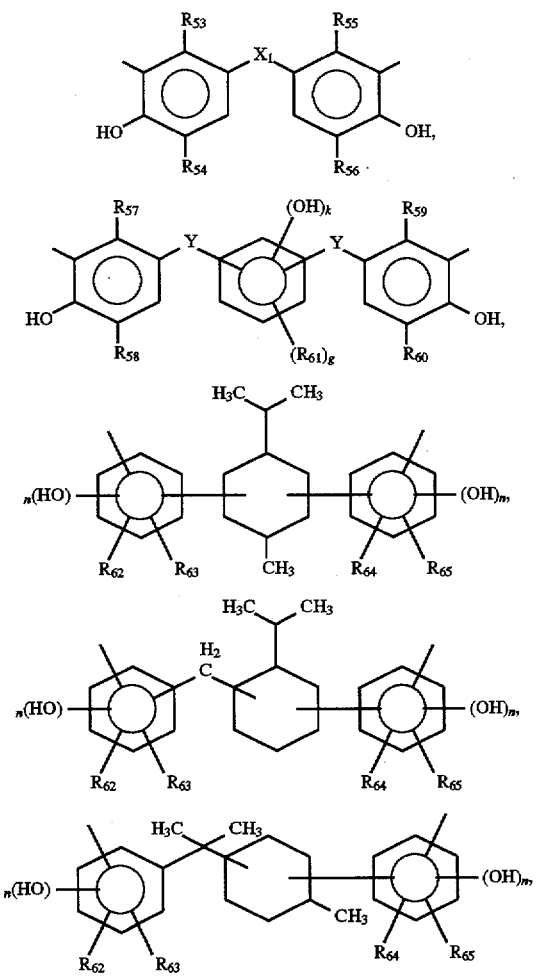

$R_{53}$ to $R_{65}$, which may be the same or different, each represents a hydrogen atom, a halogen atom, an alkyl group, an alkenyl group, an aryl group, an alkoxy group or a cycloalkyl group;

$X_1$ and Y, which may be the same or different, each represents a single bond or $—C(R_{68})(R_{69})—$ (wherein $R_{68}$ and $R_{69}$, which may be the same or different, each represents a hydrogen atom or an alkyl group);

g represents an integer of from 0 to 3;

k represents 0 or 1; and n represents 1 or 2.

DETAILED DESCRIPTION OF THE INVENTION

The present invention is described in detail below.

The alkyl group represented by $R_{1i}$ to $R_{11i}$ in formula ($I_i$) is preferably an alkyl group having from 1 to 4 carbon atoms such as methyl, ethyl, propyl, isopropyl, n-butyl, isobutyl, sec-butyl and tert-butyl, more preferably a methyl group, an ethyl group, a propyl group or an isopropyl group. The halogen atom represented by $R_{1i}$ to $R_{3i}$ is preferably a chlorine atom, a bromine atom or a iodine atom, more preferably a chlorine atom. The cycloalkyl group is preferably a cyclopentyl group or a cyclohexyl group. The alkoxy group is preferably a lower alkoxy group having from 1 to 4 carbon atoms such as methoxy and ethoxy, preferably a methoxy group. The aryl group is preferably a phenyl group, a toluyl group, a xylyl group, a cumenyl group or a mesityl group. The alkenyl group is preferably a vinyl group, a propenyl group or an allyl group, more preferably an allyl group.

In formula ($I_i$), $R_{1i}$ and $R_{2i}$ each is preferably a hydrogen atom, a chlorine atom or a methyl group, $R_{3i}$ is preferably, a hydrogen atom, a chlorine atom, a methyl group, an ethyl group, a cyclohexyl group, a methoxy group, a phenyl group or an allyl group, $R_{4i}$ and $R_{5i}$ each is preferably a hydrogen atom, a methyl group, an ethyl group or an isopropyl group, $R_{6i}$ to $R_{11i}$ each is preferably a hydrogen atom or a methyl group, and $A_i$ is preferably a single bond, $—O—$, $—S—$,

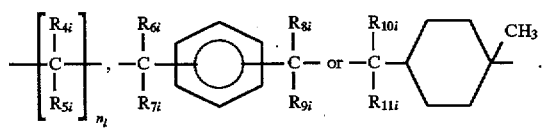

In the compound represented by formula ($I_i$) of the present invention, the aromatic rings are linearly disposed and, it is preferred that the aromatic ring located not at the terminal has a substituent capable of providing electronic or sterical prevention effect of esterification of the hydroxyl group at the 2- or 2,6-position of the hydroxyl group.

In the compound (A) described in JP-A-2-296349, the aromatic rings are linearly disposed as in the present invention and the aromatic ring located not at the terminal has a methylene group at the 2-position thereof, which is, however, insufficient and cannot provides effects as obtained in the present invention.

Specific examples of the compound represented by formula ($I_i$) of the present invention are set forth below. However, the present invention is by no means limited thereto. These compounds may be used either individually or in combination of two or more thereof.

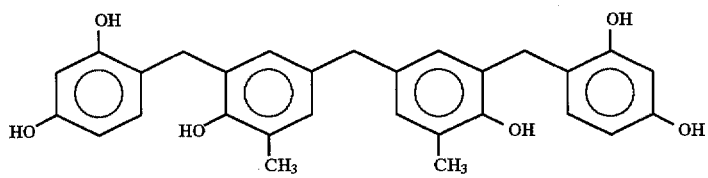 [I-1]
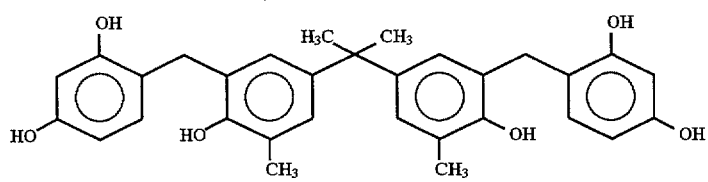 [I-2]
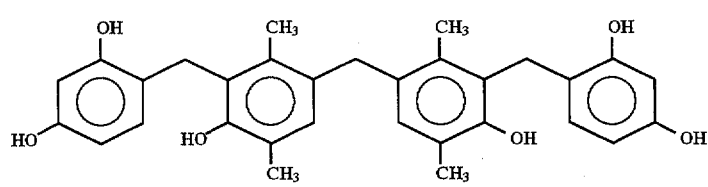 [I-3]
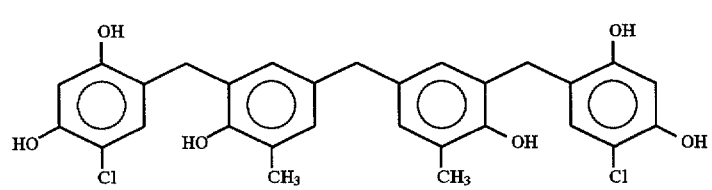 [I-4]
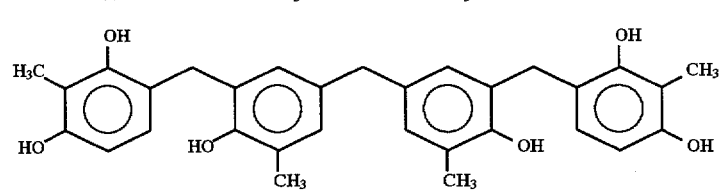 [I-5]
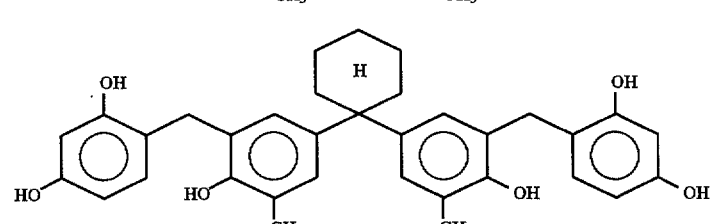 [I-6]
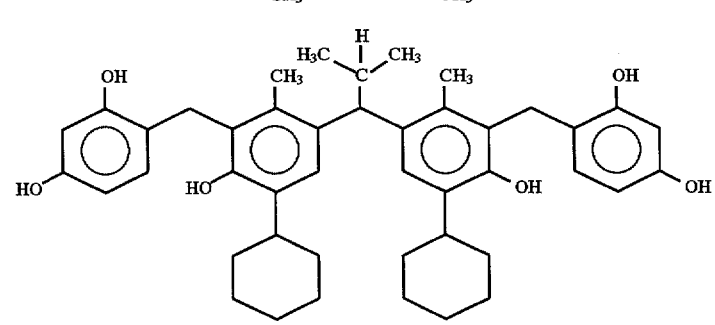 [I-7]
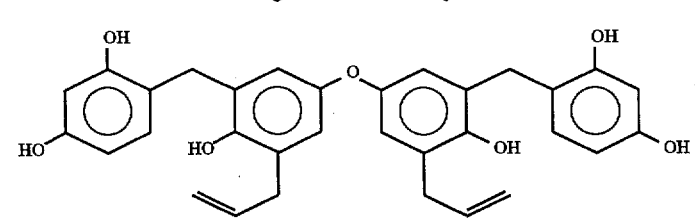 [I-8]

-continued
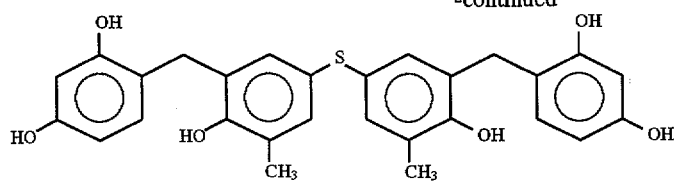 [I-9]
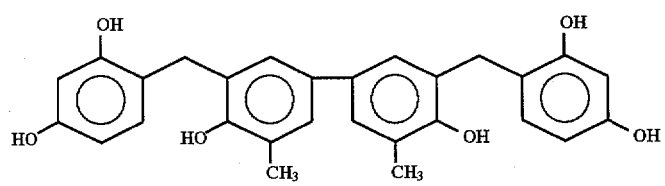 [I-10]
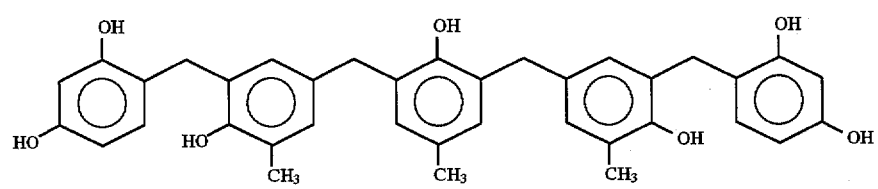 [I-11]
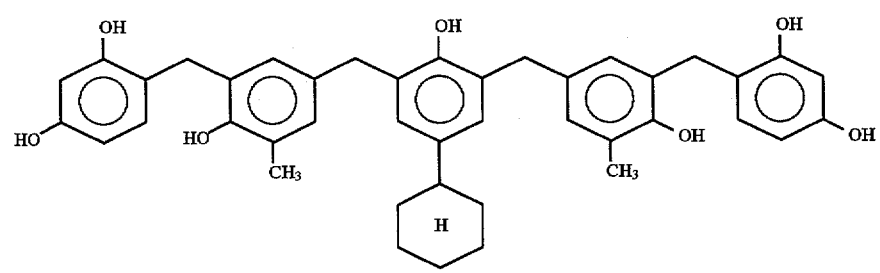 [I-12]
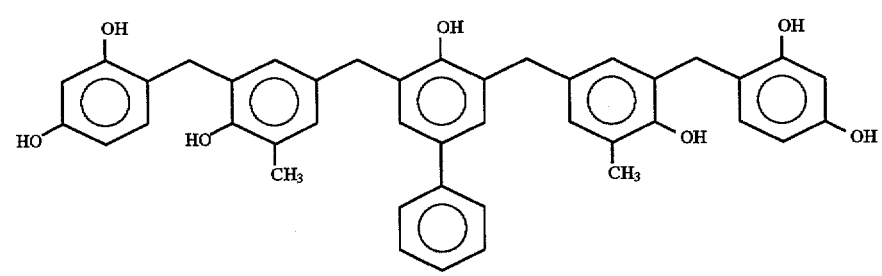 [I-13]
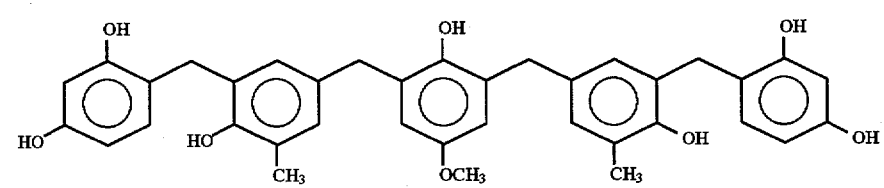 [I-14]
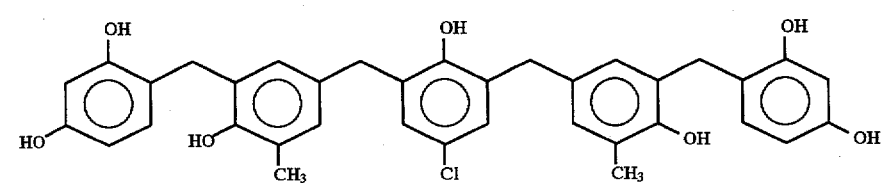 [I-15]
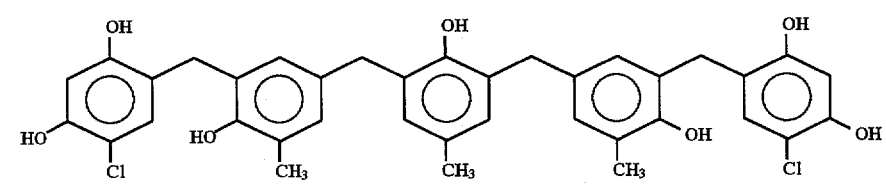 [I-16]

-continued
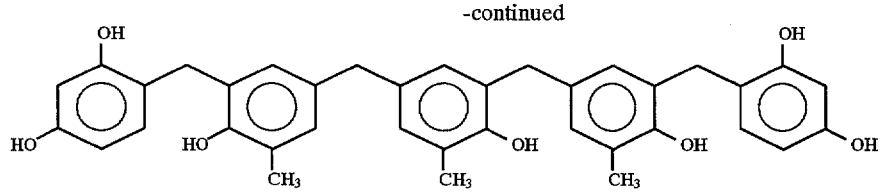
[I-17]
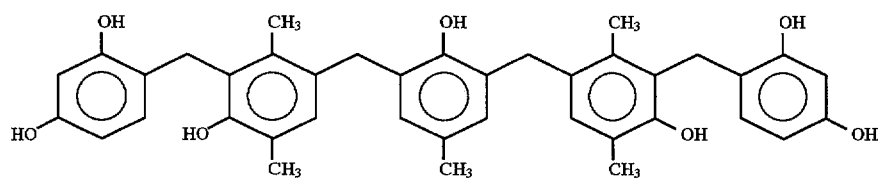
[I-18]
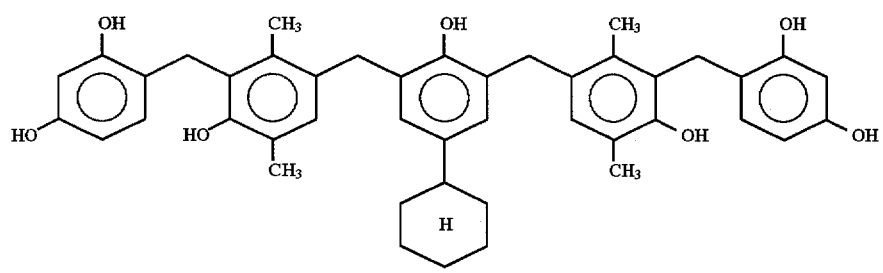
[I-19]
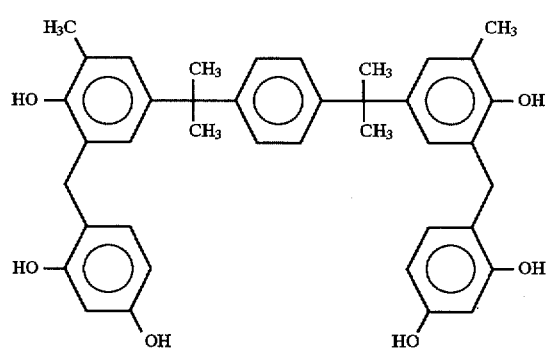
[I-20]
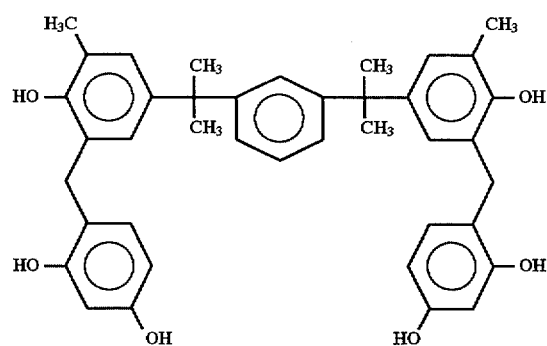
[I-21]
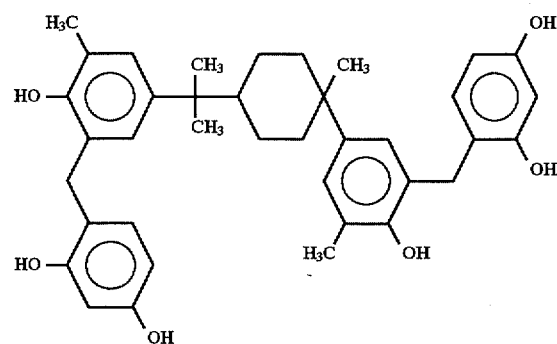
[I-22]

In formula (I), the alkyl group of $R_1$ to $R_{22}$, $R_{30}$ to $R_{35}$ and $R_{40}$ to $R_{43}$ is preferably an alkyl group having from 1 to 4 carbon atoms such as methyl, ethyl, propyl, isopropyl, n-butyl, isobutyl, sec-butyl and tert-butyl, more preferably a methyl group, an ethyl group, a propyl group or an isopropyl group. The cycloalkyl group of $R_7$ to $R_{22}$ and $R_{43}$ is preferably a cyclopentyl group or a cyclohexyl group. The alkenyl group having from 2 to 5 carbon atoms of $R_7$ to $R_{22}$ and $R_{43}$ is preferably a vinyl group, a 2-propenyl group or an allyl group. The aryl group of $R_{43}$ is preferably a phenyl group, a toluyl group, a xylyl group, a cumenyl group or a mesityl group. The alkoxy group of $R_{43}$ is preferably a lower alkoxy group such as methoxy and ethoxy, more preferably a methoxy group or an ethoxy group.

In formula (I), $R_1$ to $R_{22}$, $R_{40}$ and $R_{41}$ each is preferably a hydrogen atom, a methyl group, an ethyl group, an isopropyl group or a halogen atom, more preferably a hydrogen atom, a methyl group or a halogen atom. $R_{30}$ to $R_{35}$ each is preferably a hydrogen atom or a methyl group. $R_{42}$ is preferably a hydrogen atom, a methyl group, an ethyl group, an isopropyl group, a hydroxyl group or a halogen atom, more preferably a hydrogen atom, a methyl group or a hydroxyl group. $R_{43}$ represents a hydrogen atom, a methyl group, an ethyl group, an isopropyl group, a cyclohexyl group, a phenyl group, a methoxy group or an ethoxy group, more preferably a methyl group, an ethyl group or a cyclohexyl group.

The compound represented by formula (I) of the present invention is preferably a selectively esterified PAC (Photo Active Compound) as produced by the method disclosed in JP-A-3-228057. In view of the selectively esterified PAC, the compound of formula (I) is preferably a selectively esterified tetraester such that the aromatic rings are disposed linearly and the aromatic ring located not at the terminal has a substituent capable of providing an electronic or sterical effect to prevent esterification of the hydroxyl group, at the 2- or 2,6-position with respect to the hydroxyl group. The area ratio of the tetraester form is preferably 40% or more, more preferably 50% or more, in the high-performance liquid chromatography.

Specific examples of the compound represented by formula (I) of the present invention include Compound Nos. I-1 to I-7 and I-11 to I-21 exemplified as the compound represented by formula ($I_r$) above, but the present invention is by no means limited thereto. These compound may be used individually or in combination of two or more thereof.

The compound represented by formula (II) is described below.

The alkyl group of $R_{51}$ to $R_{69}$ in formula (II) is preferably an alkyl group having from 1 to 4 carbon atoms such as methyl, ethyl, propyl, isopropyl, n-butyl, isobutyl, secbutyl and tert-butyl, more preferably a methyl group, an ethyl group, a propyl group or an isopropyl group, more preferably a methyl group or an ethyl group. The halogen atom of $R_{51}$ to $R_{65}$ is preferably a chlorine atom, a bromine atom, or an iodine atom, more preferably a chlorine atom. The alkenyl group of $R_{51}$ to $R_{65}$ is preferably a vinyl group, a propenyl group or an allyl group. The aryl group of $R_{51}$ to $R_{65}$ is preferably a phenyl group, a toluyl group, a xylyl group, a cumenyl group or a mesityl group. The alkoxy group of $R_{51}$ to $R_{65}$ is preferably a lower alkoxy group such as methoxy and ethoxy, more preferably a methoxy group or an ethoxy group. The cycloalkyl group of $R_{51}$ to $R_{65}$ is preferably a cylopentyl group or a cylohexyl group. The acyl group of $R_{51}$ and $R_{52}$ is preferably a formyl group, an acetoxy group or a benzoyl group.

In Formula (II), $R_{51}$ and $R_{52}$ each is preferably a hydrogen atom, a chlorine atom, a methyl group, an ethyl group, an allyl group, a phenyl group, a methoxy group or a cyclohexyl group, more preferably a hydrogen atom, a chlorine atom, a methyl group, an ethyl group, an allyl group or a methoxy group, still more preferably a hydrogen atom, a chlorine atom or a methyl group, particularly preferably a hydrogen atom or a chlorine atom. $R_{53}$ to $R_{60}$ each is preferably a hydrogen atom, a methyl group, an ethyl group, an allyl group or a cylohexyl group, more preferably a hydrogen atom, a methyl group or an allyl group. $R_{61}$ is preferably a hydrogen atom, a methyl group, an ethyl group, a methoxy group, a phenyl group or a cyclohexyl group, more preferably a hydrogen atom, a methyl group, a phenyl group or a cyclohexyl group. $R_{62}$ to $R_{65}$ each is preferably a hydrogen atom or a methyl group. The linking chain A is preferably —S—, —O— or —CH$_2$—, more preferably —CH$_2$—. The linking chains $X_1$ and Y each is preferably a single bond or —C($R_{68}$)($R_{69}$)— where $R_{68}$ and $R_{69}$ are not combined to form a ring, more preferably —C($R_{68}$)($R_{69}$)— where at least one of $R_{68}$ and $R_{69}$ is a hydrogen atom.

With respect to the substitution site of each substituent, the hydroxyl group on the terminal aromatic ring is positioned at the para or meta position, more preferably the para position, to the linking chain. At least one of the two ortho-positions of the hydroxyl group on the terminal aromatic ring is preferably a hydrogen atom so as not to prevent esterification of the hydroxyl group. In the case of a chlorine atom which is considered to accelerate the esterification, it may be positioned at the 2,6-position of the hydroxyl group. Particularly preferred examples of the terminal aromatic ring structure include a phenol structure, an o-chloro structure and a 2,6-dichloro structure.

It is not preferred that the two ortho-positions of the hydroxyl group on the internal aromatic ring have a hydrogen atom at the same time. In other words, it is preferred to introduce a substituent which electronically or sterically prevents esterification of the hydroxyl group, into the both ortho-positions of the hydroxyl group.

The compound represented by formula (II) of the present invention is preferably a selectively esterified PAC as produced by the method disclosed in JP-A-3-228057. In view of the selectively esterified PAC, the compound of formula (II) is preferably a selectively esterified diester such that the aromatic rings are disposed linearly and the hydroxyl group on an aromatic ring located not at the terminal has a substituent capable of providing an electronic or sterical effect to prevent esterification of the hydroxyl group, at the 2- or 2,6position of the hydroxyl group. In this case, the area ratio of the diester form is preferably 40% or more, more preferably 50% or more, in the high-performance liquid chromatography.

Specific examples of the compound represented by formula (II) of the present invention are set forth below, but the present invention is by no means limited thereto. These compound may be used individually or in combination of two or more thereof.

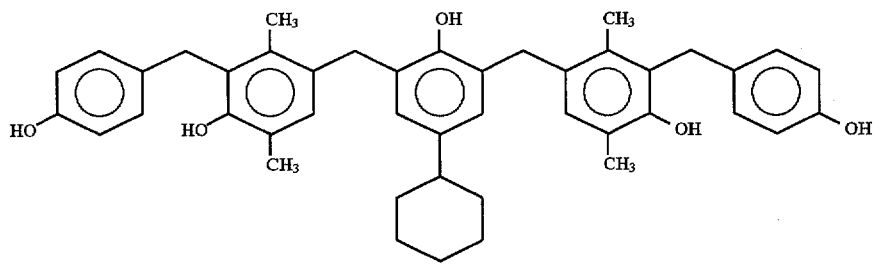
[II-1]
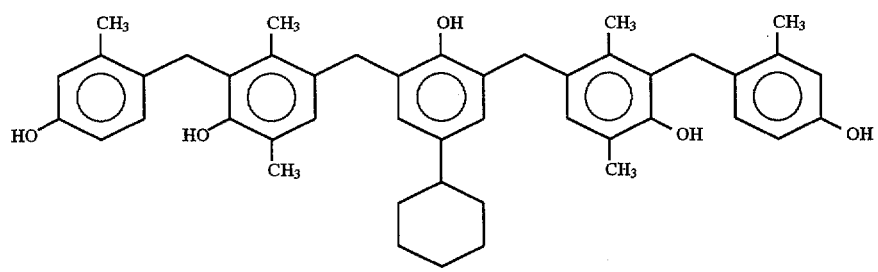
[II-2]
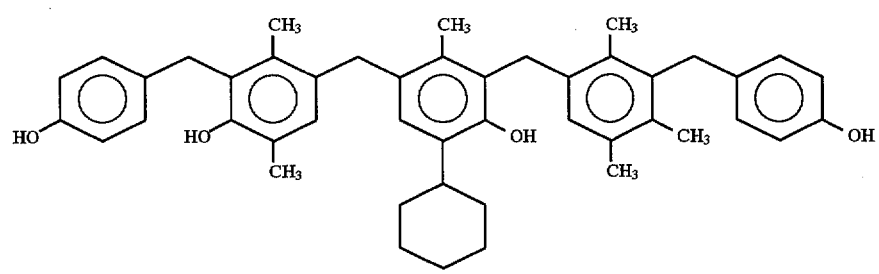
[II-3]
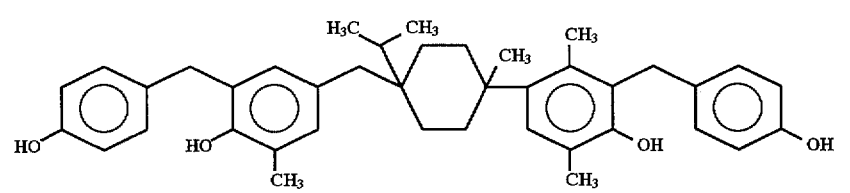
[II-4]
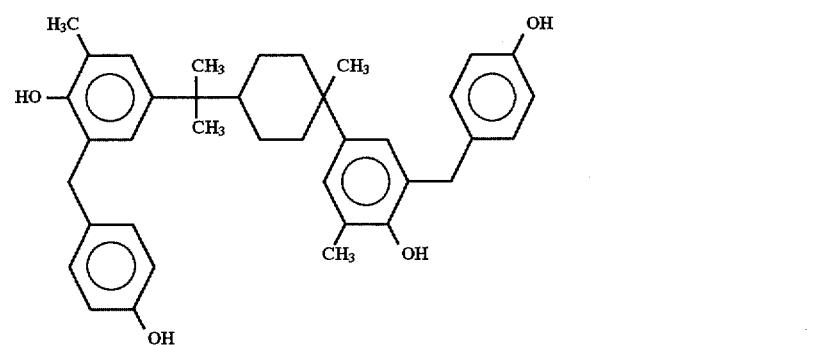
[II-5]
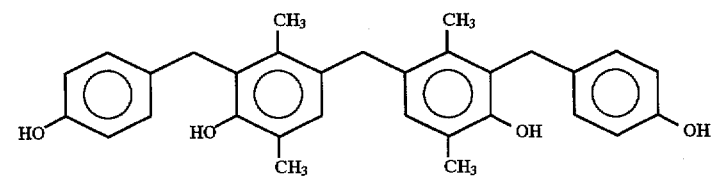
[II-6]

-continued
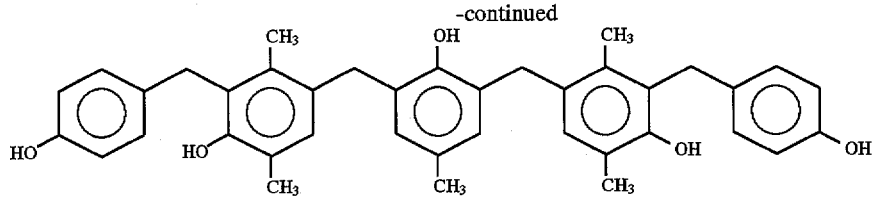 [II-7]
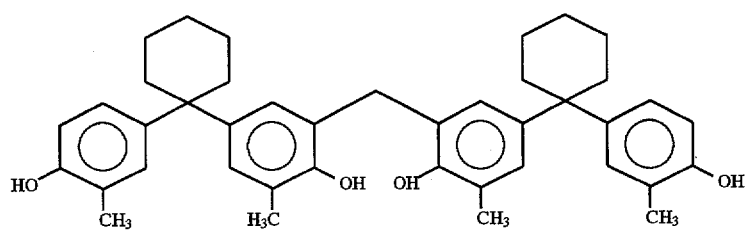 [II-8]
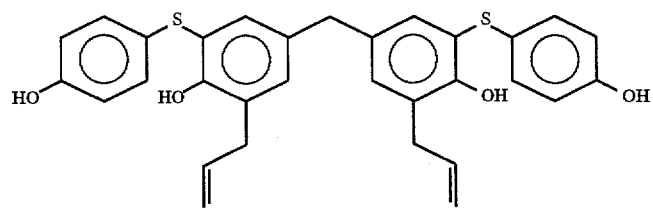 [II-9]
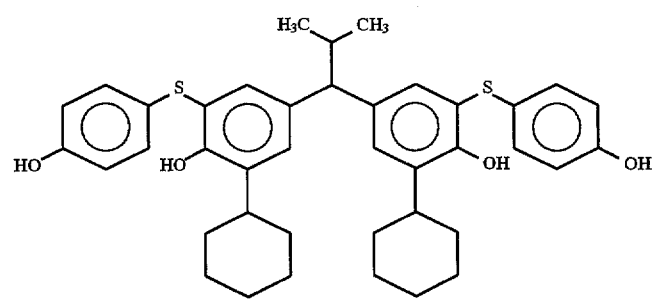 [II-10]
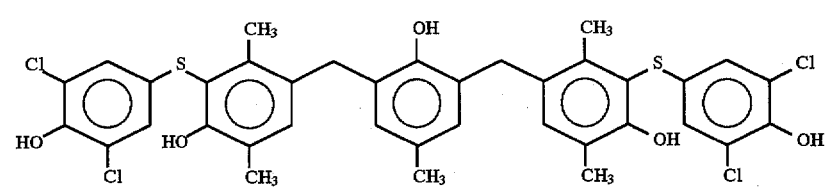 [II-11]
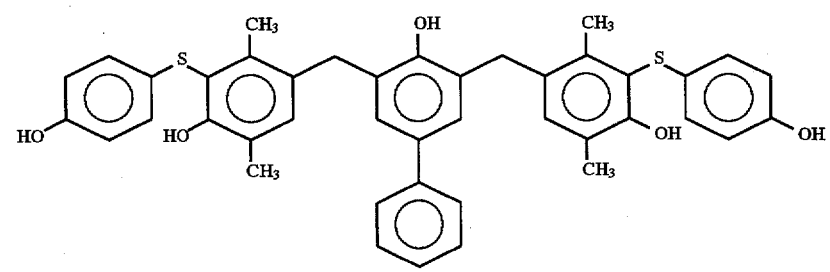 [II-12]
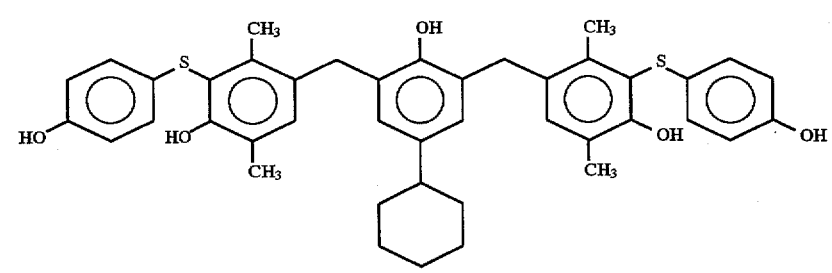 [II-13]

-continued

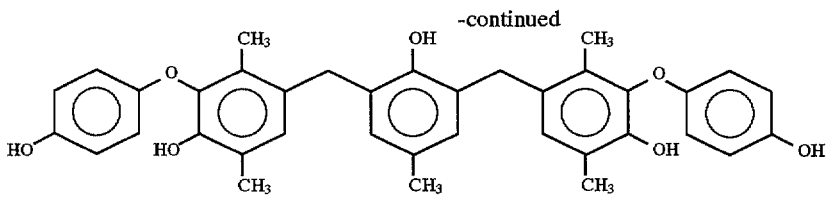
[II-14]

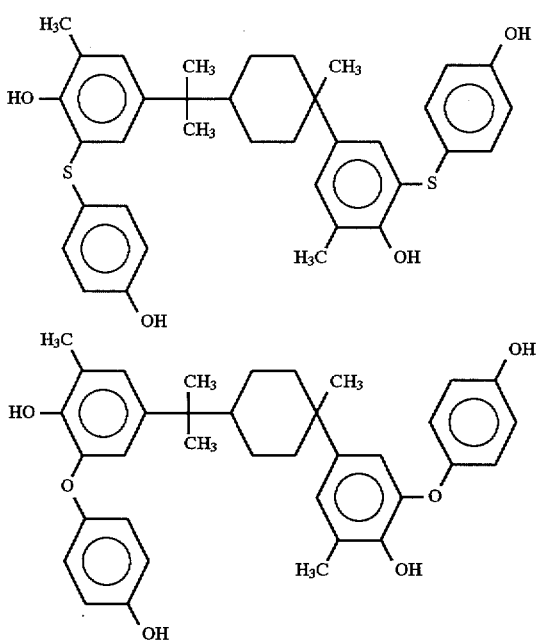

[II-15]

[II-16]

The photosensitive material of the present invention can be obtained by esterifying, for example, the above-described polyhydroxy compound and 1,2-naphthoquinonediazide-5 (and/or-4-)sulfonyl chloride in the presence of a basic catalyst.

More specifically, a polyhydroxy compound, 1,2-naphthoquinonediazide-5-(and/or -4-)sulfonyl chloride and a solvent such as acetone, methyl ethyl ketone, dioxane, dimethoxyethane, tetrahydrofuran, diglyme, ethyl acetate, dichloromethane, chloroform, γ-butyrolactone or N-methylpyrrolidone, each in a predetermined amount are charged into a flask, and thereto a basic catalyst such as sodium hydroxide, sodium carbonate, triethylamine, 4-dimethylaminopyridine, N-methylmorpholine, N-methylpiperazine or N-methylpyrrolidine is added dropwise to effect condensation. The resulting product is crystallized in water, washed with water and purification-dried.

In usual esterification, a mixture of esters different in the esterification number and the esterification site is obtained. However, when the polyhydroxy compound of formula ($I_i$) is used, a tetraester form can be selectively obtained with ease. The tetraester form content needs to be 50% or more of the area in the high-performance liquid chromatography. If the tetraester form content is less than 50%, the film thickness dependency is large and the effect of the present invention cannot be exerted. The tetraester form content is preferably 55% or more, more preferably 60% or more.

Next, esterification of the polyhydroxy compound of formula (I) or (II) is described below.

By selecting the synthesis condition or the structure of the polyhydroxy compound, a specific isomer only may be selectively synthesized. The term "average esterification ratio" as used in the following is defined as an average of the esterification ratios in the mixture of esters different in the esterification ratio.

The esterification ratio as defined above can be controlled by the molar ratio of the quinonediazidesulfonyl chloride and the polyhydroxy compound to be mixed as raw materials. More specifically, since the quinonediazidesulfonyl chloride added substantially all causes esterification reaction, a mixture having a desired average esterification ratio may be obtained by controlling the charging ratio (molar ratio) of the quinonediazidesulfonyl chloride and the polyhydroxy compound as raw materials, namely, molar number of quinoediazidesulfonyl chloride charged/molar number of polyhydroxy compound charged.

For example, in the case where the polyhydroxy compound represented by formula (I) is a compound having six OH groups in the molecule, the molar ratio of 1,2-naphthoquinonediazide5-(and/or -4-) sulfonyl chloride to the polyhydroxy compound represented by formula (I) is preferably from 2.5 to 5.0, more preferably 3.0 to 4.8, still more preferably from 3.5 to 4.5. In other words, the average esterification ratio is preferably from 42 to 83%, more preferably from 50 to 80%, still more preferably from 58 to 75%.

In the case where the polyhydroxyl compound represented by formula (I) is a compound having seven OH groups in the molecule, the above-described molar ratio is preferably from 2.45 to 5.6, more preferably from 3.15 to 4.9, still more preferably 3.5 to 4.55. In other words, the average esterification ratio is preferably from 35 to 80%, more preferably from 45 to 70%, still more preferably from 50 to 65%.

The molar ratio of the 1,2-naphthoquinonediazide-5(and/ or -4-)sulfonyl chloride to the polyhydroxy compound represented by formula (II) is preferably from 1.0 to 3.0, more preferably from 1.2 to 2.8, still more preferably from 1.5 to 2.5. In other words, the average esterification ratio is preferably from 25 to 75%, more preferably from 30 to 70%, still more preferably from 37.5 to 62.5%.

The 1,2-naphthoquinonediazide-5-(and/or -4-)sulfonic ester of the compound represented by formula (I) and the 1,2-naphthoquinonediazide-5-(and/or -4-)sulfonic ester of the compound represented by formula (II) each may be used in combination of two or more thereof in the resist composition of the present invention.

The 1,2-naphthoquinonediazide-5-(and/or -4-)sulfonic ester of the compound represented by formula (I) and the 1,2-naphthoquinonediazide-5-(and/or -4-)sulfonic ester of the compound represented by formula (II) are added to the resist composition generally at a proportion of from 5/95 to 60/40, preferably from 10/90 to 40/60.

In using the photosensitive compound of the present invention synthesized by the above-described method as a resin composition, the compounds are compounded with an alkali-soluble resin individually or in combination of two or more and the compounding amount is such that the total amount of the photosensitive material of the present invention (1,2-naphthoquinonediazide-5-(and/or -4-)sulfonic ester of a hydroxy compound of formula ($I_i$), (I) or (II)) is generally from 5 to 100 parts by weight, preferably from 20 to 60 parts by weight, per 100 parts by weight of the alkali-soluble resin. If the use ratio is less than 5 parts by weight, the film remaining ratio is liable to be extremely reduced, whereas if it exceeds 100 parts by weight, the sensitivity and the solubility in a solvent are liable to be reduced.

In the present invention, the above-described photosensitive material must be used, but if desired, an esterified product of the following polyhydroxy compounds with 1,2-naphthoquinonediazide-5-(and/or -4-)sulfonyl chloride may be used in combination.

In this case, the ratio of the naphthoquinonediazide ester photosensitive material of these polyhydroxy compounds to the photosensitive material of the present invention is preferably from 20/80 to 80/20 (by weight). In other words, if the photosensitive material of the present invention is less than 20% by weight of the entire photosensitive material, there is a possibility that the effect of the present invention cannot be exerted sufficiently.

Examples of the polyhydroxy aromatic compound include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone and 2,3,4,3',4',5'-hexahydroxybenzophenone; polyhydroxyphenylalkyl ketones such as 2,3,4-trihydroxyacetophenone and 2,3,4-trihydroxyphenylhexyl ketone; bis((poly)hydroxyphenyl) alkanes such as bis(2,4-dihydroxyphenyl)methane, bis(2,3,4-trihydroxyphenyl) methane and bis (2,4-dihydroxyphenyl) propane-1; polyhydroxybenzoates such as propyl 3,4,5-trihydroxybenzoate and phenyl 3,4,5-trihydroxybenzoate; bis(polyhydroxybenzoyl)-alkanes or bis (polyhydroxybenzoyl)aryls such as bis(2,3,4-trihydroxybenzoyl)methane and bis(2,3,4-trihydroxybenzoyl)-benzene; alkylene di(polyhydroxybenzoates) such as ethylene glycol di(3,5-dihydroxybenzoate); polyhydroxybiphenyls such as 3,5,3', 5'-biphenyltetrol, 2,4,2',4'-biphenyltetrol, 2,4,6,3',5'-biphenylbentol and 2,4,6,2',4',6'-biphenylhexol; polyhydroxytriphenylmethanes such as 4,4',4"-trihydroxy-3,5,3',5'-tetramethyltriphenylmethane, 4,4',4"-trihydroxy-3"-methoxy-3,5,3',5'-tetramethyltriphenylmethane, 4,4',2"-trihydroxy-3, 5,3',5'-tetramethyltriphenylmethane, 4,4',2"-trihydroxy-2, 2'-dimethyl-5,5'-dicyclohexyltriphenylmethane, 4,4',2"-trihydroxy-2,5,2',5'-tetramethyltriphenylmethane, 4,4',3",4"-tetrahydroxy-3,5,3', 5'-tetramethyltriphenylmethane, 4,4',2",3",4"-pentahydroxy-3,5,3',5'-tetramethyltriphenylmethane and 2,3,4,2',3',4',3",4"-octahydroxy-5,5'-diacetyltriphenylmethane; polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5', 6',7'-hexol, 3,3,3',3'-tetramethyl-1,1'-spirobiindane,4,5,6,4',5',6'-hexol and 3,3,3',3'-tetramethyl-1,1'-spirobiindane-4,5,6,5',6',7'-hexol; polyhydroxyphthalides such as 3,3-bis(3,4-dihydroxyphenyl) phthalide, 3,3-bis(2,3,4-trihydroxyphenyl)phthalide, 3',4',5',6'-tetrahydroxyspiro (phthalide-3,9'-xanthene; polyhydroxybenzopyranes such as 2-(3,4-dihydroxyphenyl)-3,5,7-trihydroxybenzopyrane, 2-(3,4,5-trihydroxyphenyl)-3,5,7-trihydroxybenzopyrane, 2-(3,4-dihydroxyphenyl)-3-(3,4,5-trihydroxybenzoyloxy)-5,7-dihydroxybenzopyrane and 2-(3,4,5-trihydroxyphenyl)-3-(3,4,5-trihydroxybenzoyloxy)-5,7-dihydroxybenzopyrane; polyhydroxyphenylchromans such as 2,4,4-trimethyl-2-(2',4'-dihydroxyphenyl)-7-hydroxychroman, 2,4,4-trimethyl-2-(2',3',4'-trihydroxyphenyl)-7,8-dihydroxychroman and 2,4,4-trimethyl-2-(2',4',6'-trihydroxyphenyl)-5,7-dihydroxychroman; hydroxybenzylphenols such as 2,6-bis(2,3,4-trihydroxybenzyl)-4-methylphenol, 2,6-bis(2,4-dihydroxybenzyl)-4-methylphenol, 2,6-bis(5-chloro-2,4-dihydroxybenzyl)-4-methylphenol, 2,6-bis(2,4,6-trihydroxybenzyl)-4-methylphenol, 2,6-bis(2-acetyl-3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,6-bis(2,5-dimethyl-4-hydroxybenzyl)-4-methylphenol, 2,6-bis(2,5-dimethyl-4-hydroxybenzyl)-4-phenylphenol, 2,6-bis(2,5-dimethyl-4-hydroxybenzyl)-4-cyclohexylphenol, 2,6-bis(4-hydroxybenzyl)-4-cyclohexylphenol, 2,6-bis{3'-(4"-hydroxybenzyl)-4'-hydroxy-5'-methylbenzyl}-4-cyclohexylphenol, 2,6-bis{3'-(3"-methyl-4"-hydroxybenzyl)-4 '-hydroxy-5'-methylbenzyl}-4-cyclohexylphenol, 2,4,6-tris(3,5-dimethyl-4hydroxybenzyl) phenol, 4,6-bis(3,5-dimethyl-4-hydroxybenzyl)pyrogallol, 2,6-bis(3-methyl-4-hydroxybenzyl)-4-methylphenol and 2,6-bis(3,5-dimethyl-4-hydroxybenzyl)-phloroglucinol; biphenols such as 2,2'-dihydroxy-5,5'-bis (4"-hydroxybenzyl)biphenol, 2,2'-dihydroxy-3,3'-dimethoxy-5, 5'-bis(4"-hydroxybenzyl)biphenol, 2,2'-dihydroxy-3,3'-dimethoxy-5,5'-bis(3",5"-dimethyl-4"-hydroxybenzyl) biphenol, 2,2'-dihydroxy-3,3'-dimethoxy-5,5'-bis(3"-methyl-4"-hydroxybenzyl)biphenol and 4,4'-dihydroxy-3,3'-dimethyl-5,5'-bis-(3",5"-dimethyl-4"-hydroxybenzyl) biphenol; hydroxyphenylalkanes such as 1,3,3,5-tetrakis(4-hydroxyphenyl)pentane, 1,1-bis{3'-(4"-hydroxybenzyl)-4'-hydroxy-5'-methylphenyl}-cyclohexane, 1,1-bis{3'-(3"-methyl-4"-hydroxybenzyl)-4'-hydroxy-5'-methylphenyl}cyclohexane, 1,1-bis{3'-(3",6"-dimethyl-4"-hydroxybenzyl)-4'-hydroxy-5'-methylphenyl}-cyclohexane, 4,4'-methylenebis{2-(4"-hydroxybenzyl)-3,6-dimethylphenol}, 4,4'-methylenebis{2-(3"-methyl-4"-hydroxybenzyl)-3,6-dimethylphenol}, 4,4'-methylenebis{2-(3"-methyl-4"-hydroxybenzyl)-3-cyclohexyl-6-methylphenol}, 4,4'-methylenebis{2-(2",4"- dihydroxybenzyl)-6-methylphenol}, 1,8-bis {3'-(4"-hydroxybenzyl)-4'-hydroxy-5'-methylphenyl}methane and 1,8-bis{3'-(3"-methyl-4"-hydroxybenzyl)-4'-hydroxy-5'-methylphenyl}methane; diphenyl ethers such as 3,3'-bis(4"-hydroxybenzyl)-4,4'-dihydroxy-5,5"-diallyldiphenyl ether, 3,3'-bis{4"-hydroxybenzyl)-4,4'-dihydroxy-5,5"-dimethyldiphenyl thioether,3,3'-bis(3"-methyl-4"-hydroxybenzyl)-4,4'-dihydroxy-5,5"-dimethyldiphenyl thioether,3,3'-bis(3",6"-dimethyl-4"-hydroxybenzyl)-4,4'-dihydroxy-5,5"-dimethyldiphenyl thioether and 3,3'-bis(3"-methyl-4"-hydroxybenzyl)-4,4'-dihydroxy-5,5"-diallyldiphenyl ether; sulfonamidophenols such as 2,6-bis (4'-hydroxybenzyl)-4-benzenesulfonamidophenol and 2,6-bis(3',6'-dimethyl-4'-hydroxybenzyl)-4-benzenesulfonamidophenol; flavonoid such as quercetin and rutin; and low nuclides of novolak and analogues thereof.

The polymer containing an aromatic hydroxyl group such as acetone-pyrogallol condensed resin or polyvinylphenol may be used in place of the low molecular weight compound. Further, the hydroxyl group of the novolak by itself may be replaced by an appropriate amount of quinonediazide to work also as a photosensitive material or a binder.

Among these, particularly preferred are those having a structure such that three or more aromatic hydroxyl groups are present in total including the moiety having one or more hydroxyl group on the same aromatic ring.

Among these, particularly preferred examples include those having at least three hydroxyl groups in total and a moiety comprising an aromatic group having at least one aromatic hydroxyl group.

Examples of the 1,2-naphthoquinonediazide-5-(and/or -4-)sulfonic ester compound of known aromatic or aliphatic polyhydroxy compounds include compounds described in JP-B-56-2333 (the term "JP-B" as used herein means an "examined Japanese patent publication"), JP-B-62-3411, JP-B-3-2293, JP-B3-42656, JP-A-58-150948, JP-A-60-154249, JP-A-60-134235, JP-A-62-10646, JP-A-62-153950, JP-A-60-146234, JP-A-62-178562, JP-A-63-113451, JP-A-64-76047, JP-A-1-147538, JP-A-1-189644, JP-A-1-309052, JP-A-2-19846, JP-A-2-84650, JP-A-2-72363, JP-A-2-103543, JP-A-2-285351, JP-A-2-296248, JP-A-2-296249, JP-A-3-48251, JP-A-3-48249, JP-A-3-119358, JP-A-3-144454, JP-A-3-185447, JP-A-4-1652, JP-A-4-60548, JP-A-5-158234, JP-A-5-224410, JP-A-5-303198, JP-A-5-297580, JP-A-5-323597, Japanese Patent Application Nos. 5-251781, 5-251780 and 5-233537, U.S. Pat. Nos. 4,797,345, 4,957,846, 4,992,356, 5,151,340 and 5,178,986, and European Patents 530,148 and 573,056.

Examples of the alkali-soluble resin for use in the present invention include novolak resin, acetone-pyrogallol resin, and polyhydroxystyrene and a derivative thereof.

Among these, particularly preferred is the novolak resin which can be obtained by addition-condensing a predetermined monomer as a main component with an aldehyde in the presence of an acidic catalyst.

Examples of the predetermined monomer include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol and hydroxy aromatic compounds such as m-chlorophenol, p-chlorophenol, o-chlorophenol, dihydroxybiphenyl, bisphenol A, phenylphenol, resorcinol and naphthol, and these monomers may be used either individually or in combination of two or more thereof, however, the present invention is by not means limited thereto.

Examples of the aldehydes include formaldehyde, paraformaldehyde, acetaldehyde, propylaldehyde, benzaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and an acetalized product of these such as chloroacetaldehydediethylacetal, and among these, formaldehyde is preferred.

These aldehydes are used either individually or in combination.

Examples of the acidic catalyst include a hydrochloric acid, a sulfuric acid, a formic acid, an acetic acid and an oxalic acid.

Also, techniques disclosed in JP-A-60-45238, JP-A-60-94347, JP-A-60-140235, JP-A-60-189739, JP-A-64-14229, JP-A-1-276131, JP-A-2-60915, JP-A-2-275955, JP-A-2-282745, JP-A-4-101147 and JP-A-4-122938, namely, those resulting from removing or reducing the low molecular weight component of the novolak resin are preferably used.

The thus-obtained novolak resin preferably has a weight average molecular weight of from 1,500 to 25,000. If the weight average molecular weight is less than 1,500, the film loss on the unexposed area after development is liable to be large, whereas if it exceeds 25,000, the development rate is liable to be reduced. The weight average molecular weight as used herein is defined by a polystyrene conversion value in gel permeation chromatography.

The dispersibility of the novolak resin (the ratio of the weight average molecular weight Mw to the number average molecular weight Mn, namely, Mw/Mn) is preferably from 1.5 to 7.0, more preferably from 1.5 to 5.0. If the dispersibility exceeds 7, there is a possibility that the effect of the present invention cannot be achieved, whereas if the dispersibility is less than 1.5, a purification process on a high level is required in the synthesis of the novolak resin and this is unreal in practice and improper.

The weight average molecular weight and the dispersibility of the novolak resin may be properly set depending on the kind of the novolak resin.

In the case when the alkali-soluble resin is a novolak resin synthesized by the condensation reaction of a mixture containing two or more of phenol, cresol, xylenol and trimethylphenol and containing m-cresol as an essential component, with an aldehyde compound, the weight average molecular weight is preferably from 5,500 to 25,000, more preferably from 6,000 to 25,000. The ratio of the weight average molecular weight to the number average molecular weight of the above-described novolak resin is preferably from 1.5 to 5.0.

In the case where the alkali-soluble resin is at least one novolak resin synthesized by the condensation reaction of a mixture containing at least four of p-cresol, o-cresol, 2,3,-xylenol, 2,6-xylenol and trimethylphenol and containing o-cresol as an essential component, with an aldehyde compound, the ratio of the weight average molecular weight to the number average molecular weight is preferably from 1.5 to 5.0 and the weight average molecular weight is preferably from 1,500 to 6,000.

As described above, depending upon the kind of the novolak resin used, the weight average molecular weight and the dispersibility are properly set to a predetermined range and thereby the effect of the present invention can be provided more outstandingly.

The low molecular weight compound having a phenolic hydroxyl group (water-insoluble alkali-soluble low molecule) which can be used in the present invention is described below.

The composition of the present invention preferably contains a water-insoluble alkali-soluble low molecule for the purpose of acceleration of dissolution in the developer. By containing it, the development latitude can be improved.

Specific examples of the water-insoluble alkali-soluble low molecule include polyhydroxy compounds. Preferred examples of the polyhydroxy compound include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)-propane, 2,2,5,5-tetrakis(4-hydroxyphenyl) hexane, 1,2-tetrakis(4-hydroxyphenyl)ethane, 1,1,3-tris (hydroxyphenyl)-butane and para[α,α,α',α'-tetrakis(4-hydroxyphenyl)]xylene.

Among these, water-insoluble alkali-soluble low molecular weight compounds having a total carbon number in one molecule of 60 or less and from 2 to 8 phenolic hydroxyl groups in one molecule are preferred.

Further, the water-insoluble alkali-soluble low molecular weight compound is preferably at least one water-insoluble alkali-soluble low molecular weight compound in which the ratio of the phenolic hydroxyl group to the aromatic ring is from 0.5 to 1.4, the total number of carbon atoms present in the molecule is from 12 to 60, and the number of the phenolic hydroxyl groups present in the molecule is from 2 to 10. Among these, particularly preferred are the compounds which, upon addition to a water-insoluble alkali-soluble resin, increase the alkali dissolution rate of the alkali-soluble resin. By using such a compound, the development latitude may be still further improved.

If the carbon number of the compound exceeds 60, the effect of the present invention is liable to be reduced, whereas if it is less than 12, other problems such as reduction in the heat resistance may newly arise. In order to achieve the effect of the present invention, it is necessary to have at least two hydroxyl groups in the molecule, but if the number of hydroxyl groups exceeds 10, the improvement effect on the development latitude may be lost. Further, if the ratio of the phenolic hydroxyl group to the aromatic ring is less than 0.5, the film thickness dependency liable to be large and also, the development latitude is liable to be narrow, whereas if the ratio exceeds 1.4, there is a possibility that the stability of the composition is deteriorated and it becomes disadvantageously difficult to obtain high resolution and good film thickness dependency.

The preferred addition amount of the low molecular weight compound is from 1 to 100% by weight, more preferably from 2 to 80% by weight, based on the alkali-soluble resin. If the addition amount exceeds 100% by weight, other problems such as worsening of the development residue or deformation of a pattern upon development disadvantageously arise.

The water-insoluble alkali-soluble low molecular weight compound having an aromatic hydroxyl group for use in the present invention can be easily synthesized by one skilled in the art by referring to the description, for example, in JP-A4-122938, JP-A-2-28531, JP-A-2-242973, JP-A-2-275995, JP-A-4-251849, JP-A-5-303199, JP-A-5-22440, JP-A-6-301204, U.S. Pat. Nos. 4,916,210, 5,210,657 and 5,318,875 and European Patent 219,294.

Examples of the solvent in which the photosensitive material and the alkali-soluble novolak resin for use in the present invention are dissolved include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cylohexanone, 4-methoxy-4-methyl-2-pentanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate and butyl acetate. These organic solvent are used individually or in combination of two or more thereof.

Further, a high boiling point solvent such as N-methylformamide, N,N-dimethylformamide, N-methylacetamide, N,N-dimethylacetamide, N-methylpyrrolidone, dimethylsulfoxide or benzyl ethyl ether may be used in combination.

The positive photoresist composition of the present invention may contain a surface active agent so as to improve coatability such as striation.

Examples of the surface active agent include a nonionic surface active agent such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), sorbitan fatty acid esters (e.g., sorbitan monolaurate, sorbitan monopalmitate, sorbitan monostearate, sorbitan monooleate, sorbitan trioleate, sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-base surface active agent such as Eftop EF301, EF303, EF352 (produced by Shin Akita Kasei KK), Megafac F171, F173 (produced by Dainippon Ink & Chemicals, Inc.), Florade FC430, 431 (produced by Sumitomo 3M KK), Asahiguard AG710, Surfron S-382, SC101, SC102, SC103, SC104, SC105 and SC106 (produced by Asahi Glass KK); an organosiloxane polymer KP341 (produced by ShinEtsu Chemical Co., Ltd.); and an acrylic acid-base or methacrylic acid-base (co)polymer, Polyflow No. 75, No. 95 (produced by Kyoei Sya Yushi Kagaku Kogyo KK). The compounding amount of the surface active agent is usually 2 parts by weight or less, preferably 1 part by weight or less, per 100 parts by weight of the alkali-soluble resin and the quinonediazide compound in the composition.

These surface active agents may be added individually or in combination of several compounds.

The developer for the positive photoresist composition of the present invention may be an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). Further, to the aqueous solution of the above-described alkali, an alcohol such as isopropyl alcohol or a surface active agent such as a nonionic surface active agent may be added in an appropriate amount.

The positive photoresist composition of the present invention may contain a light absorbent, a crosslinking agent or an adhesion aid, if desired. The light absorbent is used, if desired, for the purpose of preventing halation from the substrate or increasing visibility when the composition is coated on a transparent substrate. Preferred examples of the light absorbent include commercially available light absorbents described in Koqyo-yo Shikiso no Gi jutsu to Shi jo (Technique and Market of Industrial Dyes), CMC Shuppan, and Senrvo Binran (Dye Handbook), Yuki Gosei Kagaku Kyokai (compiler), such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10 and C.I. Pigment Brown 2. The light absorbent is usually compounded in an amount of 100 parts by weight or less, preferably 50 parts by weight or less, more preferably 30 parts by weight or less, per 100 parts by weight of the alkali-soluble resin.

The crosslinking agent is used in the range such that the formation of a positive image is not influenced. The object of adding a crosslinking agent is mainly to control sensitivity, to improve heat resistance and to improve dry etching durability.

Examples of the crosslinking agent include a compound resulting from letting formaldehyde act on melamine, benzoguanamine or glycoluril, an alkyl-modified product thereof, an epoxy compound, an aldehyde, an azide compound, an organic peroxide and hexamethylenetetramine. The crosslinking agent may be compounded in a proportion of less than 10 parts by weight, preferably less than 5 parts by weight, per 100 parts by weight of the photosensitive material. If the compounding amount of the crosslinking agent exceeds 10 parts by weight, the sensitivity is liable to be reduced and scum (resist residue) is generated, thus this is not preferred.

The adhesion aid is added mainly for the purpose of improving adhesion of the resist to the substrate, particularly for preventing the peeling off of the resist during etching. Specific examples of the adhesion aid include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole and mercaptopyrimidine, and urea or thiourea compounds such as 1,1-dimethylurea and 1,3-dimethylurea.

The adhesion aid is compounded in a proportion of usually less than 10 parts by weight, preferably less than 5 parts by weight, per 100 parts by weight of the alkali-soluble resin.

The above-described positive photoresist composition is coated on a substrate used in the production of precision integrated circuit element (for example, transparent substrate such as silicon/silicon dioxide coating, glass substrate or ITO substrate) by an appropriate coating method such as spin coating, roll coating, flow coating, dip coating, spray coating or doctor coating, and then pre-baked, exposed th rough a predetermined mask, subjected to post exposure baking (if desired), developed, rinsed and dried, and thereby a good resist can be obtained.

EXAMPLES

The present invention is described in greater detail below, but the present invention should not be construed as being limited thereto. Unless otherwise indicated, the "%" indicates "% by weight".

EXAMPLE 1

Synthesis Example (1): Synthesis of Compound (I-1)

Into a four-necked flask equipped with a stirrer, a reflux condenser tube, a thermometer and a drip feeder, 114 g of bis(3-methyl-4-hydroxyphenyl)methane, 456 g of a 25% aqueous solution of tetramethylammonium hydroxide and 50 ml of distilled water were charged, the mixture was stirred at room temperature to completely dissolve the bis(3-methyl-4hydroxyphenyl)methane, 242 g of a 37% aqueous formalin solution was added dropwise thereto and the mixture was stirred as it was for 12 hours. The resulting reaction mixed solution was neutralized with a 1% aqueous hydrochloric acid solution and the white solid deposited was recovered by filtration to obtain 103 g of a methylol product.

Into a similar reaction apparatus, 91 g of the methylol product obtained above, 1.32 kg of resorcin, 8 g of paratoluene sulfonic acid monohydrate and 2.4 l of methanol were charged and the mixture was uniformly heated and stirred under reflux. The mixed solution was stirred as it was for 8 hours and crystallized in 24 l of ice water and the white solid deposited was recovered by filtration. The resulting white solid was recrystallized in distilled water to obtain 56.7 g of Compound (I-1).

Synthesis Example (2): Synthesis of Compound (I-2)

Compound (I-2) was synthesized by the same operation as in Synthesis Example (1) except for using 2,2-bis(3-methyl-4-hydroxyphenyl)propane in place of (3-methyl-4-hydroxyphenyl)-methane.

Synthesis Example (3): Synthesis of Compound (I-3)

Into a four-necked flask equipped with a stirrer, a reflux condenser tube, a thermometer and a drip feeder, 128 g of bis(2,5-dimethyl-4-hydroxyphenyl)methane, 1 l of ethanol and 450 g of a 50% aqueous dimethylamine solution were charged and completely dissolved, 400 g of a 37% aqueous formalin solution was added dropwise thereto over 1 hour and the mixture was reacted under reflux. The white solid deposited was recovered by filtration and washed with water to obtain 176 g of an aminomethyl product.

Into a similar reaction apparatus, 148 g of the aminomethyl product obtained above and 1.63 kg of acetic anhydride were charged and the mixture was reacted under reflux for 24 hours. The resulting reaction mixed solution was concentrated under reduced pressure, the concentrate was crystallized with water and the brown solid deposited was recovered by filtration to obtain 152 g of an acetoxy product.

Into a similar reaction apparatus, 120 g of the acetoxy product obtained above, 990 g of resorcin, 6 g of paratoluenesulfonic acid monohydrate and 1.8 l of methanol were charged and the mixture was uniformly heated and stirred under reflux. The resulting reaction mixed solution was stirred as it was for 8 hours and crystallized with 18 l of ice water and the brown solid deposited was recovered by filtration. The solid obtained was recrystallized in distilled water to obtain 45.0 g of Compound (I-3).

Synthesis Example (4): Synthesis of Compound (I-8)

Into a four-necked flask equipped with a stirrer, a reflux condenser tube, a thermometer and a drip feeder, 60.7 g of bis(4-hydroxyphenyl) ether, 76.2 g of allyl bromide, 91.2 g of potassium carbonate and 1.2 l of dimethylformamide were charged and heated at 70° C. for 8 hours while stirring. The resulting reaction mixed solution was poured into 3 l of distilled water and the white powder deposited was recovered by filtration. The powder was recrystallized in water to obtain 58 g of a diallyl ether product as white crystal.

Into a similar reaction apparatus, 40 g of the diallyl ether product obtained above and 120 ml of N,N-dimethylaniline were charged and the mixture was heated at 195° C. for 7 hours while stirring. After the reaction, N,N-dimethylaniline was distilled off under reduced pressure and the resulting brown viscous material was purified by column chromatography to obtain 18 g of an O-allylated product.

Further, into a similar reaction apparatus, 18 g of the O-allylated product obtained above, 35 g of a 50% aqueous solution of dimethylamine and 100 ml of ethanol were charged and made uniform, 32 g of a 37% aqueous formalin solution was added dropwise thereto and the mixture was stirred under reflux for 3 hours. The reaction solution was poured into 1.2 l of brine and extracted with ethyl acetate to obtain 24 g of an aminomethyl product.

Into a similar reaction apparatus, 24 g of the aminomethyl product obtained above and 100 ml of acetic anhydride were charged and heated at 150° C. for 4 hours while stirring. After the reaction, the acetic anhydride was distilled off under reduced pressure and the residue was diluted with acetone, recrystallized in 1.2 l of distilled water, extracted with ethyl acetate and purified by column chromatography. As a result, 27 g of an acetoxy product was obtained as a light yellow viscous material.

Finally, 27 g of the acetoxy product obtained above, 200 g of resorcin, 300 ml of methanol and 1 g of p-toluenesulfonic acid were charged into a similar reaction apparatus and heated for 8 hours while stirring. The reaction mixed solution was recrystallized in 3 l of ice water and the white powder deposited was filtered and recrystallized in distilled water to obtain 12 g of Compound (I-8).

Synthesis Example (5): Synthesis of Compound (I-11)

Into a four-necked flask equipped with a stirrer, a reflux condenser tube, a thermometer and a drip feeder, 84 g of bis(hydroxymethylene)-p-cresol, 324 g of o-cresol and 1 l of methanol were charged, stirred and made uniform, 5 g of concentrated sulfuric acid was added thereto, and the mixture was heated for 4 hours while stirring under reflux. After completion of the reaction, the reaction solution was crystallized in 10 l of distilled water and the resulting solid was washed with a mixed solvent of hexane and toluene to obtain 143 g of trinuclide as a white solid.

Into a similar reaction apparatus, 105 g of the trinuclide obtained above, 410 g of a 25% aqueous solution of tetramethylammonium hydroxide and 50 ml of distilled water were charged, stirred and made uniform, 146 g of a 37% aqueous formalin solution was added dropwise, and the mixture was stirred as it was for 8 hours. The resulting reaction mixed solution was neutralized with a 1% aqueous hydrochloric acid solution and the white solid precipitated was recovered by filtration to obtain 104 g of a trinuclide methylol product.

Into a similar reaction apparatus, 82 g of the trinuclide methylol product obtained above, 660 g of resorcin and 1.2 l of methanol were charged and heated while stirring under reflux to make the mixture uniform. The mixed solution was stirred as it was for 8 hours and recrystallized in 12 l of ice water, and the white solid deposited was recovered by filtration. The resulting white solid was recrystallized in distilled water to obtain 35.6 g of Compound (I-11).

Synthesis Example (6): Synthesis of Photosensitive Material a

Into a three-necked flask, 47.3 g of Compound (I-1), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried (at 40° C.) to obtain 126.1 g of 1,2-naphthoquinonediazide-5-sulfonic ester of Compound (I-1) (Photosensitive Material a).

In a high-performance liquid chromatography determined by means of a detector using ultraviolet rays of 254 nm, the tetraester form of Photosensitive Material a accounted for 64% of the entire pattern area.

The determination of the above-described high-performance liquid chromatography was conducted in a chromatography apparatus LC-6A manufactured by Shimadzu Corporation with columns Nova-Pak C18 (4 µm) of 8 mmφ×100 mm manufactured by Waters Co., Ltd, using a solution consisting of 68.6% of distilled water, 30.0% of acetonitrile, 0.7% of triethylamine and 0.7% of phosphoric acid as a carrier solvent, at a flow velocity of 2.0 ml/min.

Synthesis Example (7): Synthesis of Photosensitive Material b

To a three-necked flask, 50.1 g of Compound (I-2), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction solution was poured into 3.2 l of a 1% aqueous hydrochloric acid solution and the precipitate generated was separated by filtration, washed with water and dried (at 40° C.) to obtain 128.7 g of 1,2-naphthoquinonediazide-5-sulfonic ester of Compound (I-2) (Photosensitive Material b).

In a high-performance liquid chromatography determined by means of a detector using ultraviolet rays of 254 nm, the tetraester form of Photosensitive Material b accounted for 65% of the entire pattern area.

Synthesis Example (8): Synthesis of Photosensitive Material c

To a three-necked flask, 50.1 g of Compound (I-3), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried (at 40° C.) to obtain 129.7 g of 1,2-naphthoquinonediazide-5-sulfonic ester of Compound (I-3) (Photosensitive Material c).

In a high-performance liquid chromatography determined by means of a detector using ultraviolet rays of 254 nm, the tetraester form of Photosensitive Material c accounted for 66% of the entire pattern area.

Synthesis Example (9): Synthesis of Photosensitive Material d

To a three-necked flask, 52.5 g of Compound (I-8), 107.5 g of 1,2-naphthoquinonediazide-5-sulfonyl chloride and 1.2 l of acetone were charged and uniformly dissolved. Then, 41.7 g of N-methylpiperidine was gradually added dropwise and reacted at 2520 C. for 3 hours. The reaction mixed solution was poured into 4.0 l of a 1% aqueous hydrochloric acid solution and the precipitate generated was separated by filtration, washed with water and dried (at 40° C.) to obtain 130.8 g of 1,2-naphthoquinonediazide-5-sulfonic ester of Compound (I-8) (Photosensitive Material d).

In a high-performance liquid chromatography determined by means of a detector using ultraviolet rays of 254 nm, the tetraester form of Photosensitive Material d accounted for 63% of the entire pattern area.

Synthesis Example (10): Synthesis of Photosensitive Material e

To a three-necked flask, 59.3 g of Compound (I-11), 107.5 g of 1,2-naphthoquinonediazide-5-sulfonyl chloride and 1.5 l of acetone were charged and uniformly dissolved. Then, 41.7 g of N-methylpiperidine was gradually added dropwise and reacted at 25° C. for 3 hours. The reaction mixed solution was poured into 5.0 l of a 1% aqueous hydrochloric acid solution and the precipitate generated was separated by filtration, washed with water and dried (at 40° C.) to obtain 136.9 g of 1,2-naphthoquinonediazide-5-sulfonic ester of Compound (I-11) (Photosensitive Material e).

In a high-performance liquid chromatography determined by means of a detector using ultraviolet rays of 254 nm, the tetraester form of Photosensitive Material e accounted for 58% of the entire pattern area.

Synthesis Example (11): Synthesis of Comparative Photosensitive Material f (f1 to f3)

According to the method described in JP-A-2-296248, 1,2-quinonediazide-5-sulfonic ester (80% or more of the hydroxyl group was the ester) of each of Polyhydroxy Compounds (I-2), (I-3) and (I-8) was synthesized.

In a high-performance liquid chromatography determined by means of a detector using ultraviolet rays of 254 nm, the tetraester form of Photosensitive Material f (f1 to f3) accounted for 40% of the entire pattern area.

Synthesis Example (12): Synthesis of Novolak Resin A

To a three-necked flask, 43 g of m-cresol, 57 g of p-cresol, 49 g of a 37% aqueous formalin solution and 0.13 g of oxalic acid were charged, the temperature was raised to 100° C. while stirring, and the mixture was reacted for 15 hours.

Thereafter, the temperature was raised to 200° C., the pressure was gradually reduced to 5 mmHg and water, unreacted monomer, formaldehyde and oxalic acid were removed. The melted alkali-soluble novolak resin was recovered by lowering the temperature to room temperature. Novolak Resin A obtained had a weight average molecular weight of 7,800 (in terms of polystyrene) and a dispersibility of 0.10.

Synthesis Example (13): Synthesis of Novolak Resin B p-Cresol (11 g), 8 g of o-cresol, 69 g of 2,3-dimethylphenol, 20 g of 2,3,5-trimethylphenol and 4.9 g of 2,6-dimethylphenol were mixed with 50 g of diethylene glycol monomethyl ether and the mixture was charged into a three-necked flask equipped with a stirrer, a reflux condenser tube and a thermometer. Then, 85 g of a 37% aqueous formalin solution was added thereto and the mixture was stirred while heating in an oil bath at 110° C. When the inner temperature reached 90° C., 6.3 g of oxalic acid dihydrate was added. Thereafter, the reaction was continued for 18 hours while keeping the temperature of the oil bath at 130° C., the reflux condenser tube was then removed and the content was distilled at 200° C. under reduced pressure to remove unreacted monomers. The resulting novolak resin had an Mw of 3,350 and a dispersibility of 2.55.

Synthesis Example (14): Synthesis of Novolak Resin C

To a three-necked flask, 50 g of m-cresol, 3 g of p-cresol, 52.6 g of 2.5-xylenol, 53 g of a 37% aqueous formalin solution and 0.15 g of oxalic acid were charged, the temperature was raised to 100° C. while stirring and the mixture was reacted for 14 hours.

Thereafter, the temperature was raised to 200° C., the pressure was gradually reduced to 1 mmHg and water, unreacted monomer, formaldehyde and oxalic acid were removed. The melted novolak resin was recovered by lowering the temperature to room temperature. The novolak resin obtained had a weight average molecular weight of 3,500 (in terms of polystyrene). Then, 20 g of the novolak resin was completely dissolved in 60 g of methanol and thereto, 30 g of water was gradually added while stirring to precipitate the resin component. The upper layer was removed by decantation and the precipitated resin component was recovered, heated at 40° C. and dried for 24 hours under reduced pressure to obtain Alkali-Soluble Novolak Resin B. The novolak resin obtained had a weight average molecular weight of 4,900 (in terms of polystyrene) and a dispersibility of 3.20. The monomer, dimer and trimer contents were 0%, 2.1% and 3.3%, respectively, and 38% of the low molecular weight component was removed by fractional reprecipitation.

Synthesis Example (15): Synthesis of Novolak Resin D

To a three-necked flask, 60 g of m-cresol, 18 g of p-cresol, 25 g of 2,3,5-trimethylphenol, 56 g of a 37% aqueous formalin solution and 0.16 g of oxalic acid were charged, the temperature was raised to 100° C. while stirring and the mixture was reacted for 16 hours.

Thereafter, the temperature was raised to 200° C., the pressure was gradually reduced to 1 mmHg and water, unreacted monomer, formaldehyde and oxalic acid were removed. The melted novolak resin was recovered by lowering the temperature to room temperature. The novolak resin obtained had a weight average molecular weight of 3,900 (in terms of polystyrene). Then, 20 g of the novolak resin was completely dissolved in 60 g of methanol, 60 g of hexane was gradually added thereto while stirring, the mixture was allowed to stand for 2 hours, the upper layer was removed by decantation, and the precipitated resin component was recovered, heated at 40° C. and dried for 24 hours under reduced pressure to obtain Alkali-Soluble Novolak Resin C. The novolak resin obtained had a weight average molecular weight of 7,800 (in terms of polystyrene) and a dispersibility of 3.20. The monomer, dimer and trimer contents were 0%, 2.1% and 3.2%, respectively, and 52% of the low molecular weight component was removed by fractional reprecipitation.

Preparation of Positive Photoresist Composition and Evaluation

Photosensitive Materials a to f (f1 to f3) obtained in Synthesis Examples (1) to (11), Novolak Resins A to D obtained in Synthesis Examples (12) to (15), 22.8 g of ethyl lactate and a polyhydroxy compound (optionally) were mixed at a proportion shown in Table 1, and each solution was made uniform and filtered through a Teflon-made microfilter having a pore size of 0.10 μm to prepare photoresist compositions. Each photoresist composition was coated on a silicon wafer by means of a spinner while varying the revolution number, and the coating was dried on a vacuum adhesion type hot plate at 90° C. for 60 seconds to obtain a photoresist film having a film thickness of 0.98 μm or 1.00 μm.

Each film was exposed using a reduction projection exposure apparatus (reduction projection exposure apparatus NSR-2005i9C, manufactured by Nikon Corporation), subjected to PEB at 120° C. for 60 seconds, developed with a 2.38% aqueous solution of tetramethylammonium hydroxide, washed with water for 30 seconds and dried.

Each of the thus-obtained resist patterns on a silicon wafer was observed through a scanning electron microscope and the resist was evaluated. The results obtained are shown in Table 2.

The sensitivity was defined by a reciprocal of the exposure amount necessary for reproducing a mask pattern of 0.50 μm and shown by a relative value to the sensitivity of the resist film having a film thickness of 0.98 μm of Comparative Example 1. The resolution shows a limiting resolution at an exposure amount necessary for producing a mask pattern of 0.50 μm.

The ratio of the resolution at a film thickness of 0.98 μm to the resolution at a film thickness of 1.00 μm was used as an index for the film thickness dependency. The value closer to 1.0 reveals that the film thickness dependency is smaller.

Development residue was observed under the condition that the film thickness was 0.97 μm and the resist pattern was 0.35 μm. When no residue was observed, the sample was rated as "A". When residue was observed, it was rated as "B".

As seen from the results, the resists using the photosensitive materials of the present invention exhibited high sensitivity, good resolution and resist performance less dependent on the film thickness.

TABLE 1

Formulation of Positive Photoresist Composition

| Example | Novolak Resin Kind | (g) | Polyhydroxy Compound Kind | (g) | Photosensitive Material I (g) | II (g) |
|---|---|---|---|---|---|---|
| 1 | A | 5.04 | none | | a 2.16 | none |
| 2 | B | 4.10 | P-3 | 1.368 | a 1.73 | none |
| 3 | C | 3.68 | " | 1.36 | a 1.08 | S-2 1.08 |
| 4 | D | 3.68 | " | 1.36 | a 1.296 | S-2 0.864 |
| 5 | B | 3.73 | " | 1.31 | a 2.16 | none |
| 6 | B | 3.73 | " | 1.31 | b 2.16 | none |
| 7 | B | 3.73 | " | 1.31 | c 2.16 | none |
| 8 | B | 3.73 | " | 1.31 | d 2.16 | none |
| 9 | B | 3.73 | " | 1.31 | e 2.16 | none |
| 10 | C | 3.47 | P-1 | 1.28 | c 1.71 | S-2 0.734 |
| 11 | C | 3.47 | P-2 | 1.28 | c 1.96 | S-2 0.49 |
| 12 | C | 3.47 | P-4 | 1.28 | c 1.96 | S-2 0.49 |
| 13 | D | 3.468 | P-1/P-5 | 0.898/0.385 | a/c 0.816/0.816 | S-1 0.816 |
| 14 | D | 3.42 | P-4 | 1.33 | c/d 0.816/0.816 | S-1 0.816 |
| 15 | B/C | 1.13/2.65 | P-1 | 1.26 | c 1.296 | a 0.864 |

TABLE 1-continued

Formulation of Positive Photoresist Composition

| Example | Novolak Resin Kind | (g) | Polyhydroxy Compound Kind | (g) | Photosensitive Material I (g) | II (g) |
|---|---|---|---|---|---|---|
| 16 | A/C | 1.241/2.89 | P-4 | 0.907 | a 1.512 | S-3 0.648 |
| Comparative Example | | | | | | |
| 1 | B | 3.73 | P-3 | 1.31 | f1 2.16 | none |
| 2 | B | 3.73 | P-3 | 1.31 | f2 2.16 | none |
| 3 | B | 3.73 | P-3 | 1.31 | f3 2.16 | none |

P-1: 1-[α-Methyl-α-(4'-hydroxyphenyl)ethyl)-4-[α',α'-bis(4"-hydroxyphenyl)ethyl]benzene
P-2: Tris(4-hydroxyphenyl)methane
P-3: 1,1-Bis(4-hydroxyphenyl)cyclohexane
P-4: Bis(2,5-dimethyl-4-hydroxyphenyl)-2'-hydroxyphenyl-methane
P-5: 2,6-Bis(2'-hydroxy-5-methylbenzyl)-4-methylphenol
S-1: 1,2-Naphthoquinonediazide-5-sulfonic acid esterified product (two equivalent) of 1,1-bis{3-(4'-hydroxy-benzyl)-4-hydroxy-5-methylphenyl}cyclohexane
S-2: 1,2-Naphthoquinonediazide-5-sulfonic acid esterified product (two equivalent) of 2,6-bis(4'-hydroxybenzyl)-4-cyclohexylphenol
S-3: 1,2-Naphthoquinonediazide-5-sulfonic acid esterified product (two equivalent) of methylenebis{2-(4'-hydroxy-3'-cyclohexylbenzyl)-6-methylphenol}

TABLE 2

| | Sensitivity | Resolution (μm) | Film Thickness Dependency | Development Residue |
|---|---|---|---|---|
| Example | | | | |
| 1 | 0.45 | 0.33 | 0.89 | A |
| 2 | 0.36 | 0.32 | 0.86 | A |
| 3 | 0.70 | 0.31 | 0.96 | A |
| 4 | 0.72 | 0.31 | 0.93 | A |
| 5 | 0.60 | 0.31 | 0.95 | A |
| 6 | 0.73 | 0.30 | 0.94 | A |
| 7 | 0.88 | 0.29 | 0.92 | A |
| 8 | 0.84 | 0.29 | 0.90 | A |
| 9 | 0.52 | 0.32 | 0.94 | A |
| 10 | 0.92 | 0.31 | 0.92 | A |
| 11 | 0.84 | 0.32 | 0.93 | A |
| 12 | 0.92 | 0.30 | 0.96 | A |
| 13 | 0.98 | 0.30 | 0.95 | A |
| 14 | 0.96 | 0.29 | 0.92 | A |
| 15 | 0.76 | 0.29 | 0.95 | A |
| 16 | 0.72 | 0.31 | 0.90 | A |
| Comparative Example | | | | |
| 1 | 1.00 | 0.38 | 0.78 | B |
| 2 | 1.22 | 0.36 | 0.84 | A |
| 3 | 1.16 | 0.35 | 0.82 | B |

The present invention can provide a positive photoresist for ultrafine working ensuring high sensitivity, high resolution and improved film thickness dependency.

EXAMPLE 2

Synthesis Example (16): Synthesis of Compound (II-1)

Into a four-necked flask equipped with a stirrer, a reflux condenser tube, a thermometer and a drip feeder, 176.3 g of 4-cyclohexylphenol, 455.8 g of a 25% aqueous solution of tetramethylammonium hydroxide and 500 ml of distilled water were charged, the mixture was heated at 50° C. and stirred to dissolve the 4-cyclohexylphenol. To the resulting mixed solution, 483.4 g of a 37% aqueous formalin solution was added dropwise and the mixture was heated and stirred as it was for 8 hours. The resulting reaction mixed solution was neutralized with hydrochloric acid and the white powder precipitated was recovered by filtration to obtain 160 g of a methylol product.

Into a similar reaction apparatus, 118 g of the methylol product obtained above, 1.2 kg of 2,5-xylenol, 1 l of methanol and 5 g of concentrated sulfuric acid were charged and the mixture was stirred under reflux for 6 hours. The reaction mixed solution obtained was poured into 10 l of distilled water and white solid deposited was subjected to steam distillation to almost remove the excessive 2,5-xylenol to thereby obtain Mixture A of trinuclide.

Further, in a similar reaction apparatus, Mixture A obtained above, 900 g of a 50% aqueous solution of dimethylamine and 1 l of ethanol were charged, the mixture was made uniform by stirring and 810 g of a 37% aqueous formalin solution was added dropwise over one hour. After completion of the dropwise addition, the mixture was stirred under reflux for 10 hours. After completion of the reaction, the white solid deposited was filtered to obtain 140 g of an aminomethyl product.

Into a similar reaction apparatus, 140 g of the aminomethyl product and 1 kg of acetic anhydride were charged and heated at 150° C. while stirring. After stirring for 15 hours, acetic anhydride in excess was distilled off under reduced pressure, the residue was dissolved in acetone and crystallized in 1 l of distilled water, and the white solid deposited was separated by filtration and washed with methanol to obtain 175 g of an acetoxy product.

Finally, 175 g of the acetoxy product obtained above, 500 g of phenol, 500 ml of methanol and 25 g of concentrated sulfuric acid were charged and stirred for 10 hours under reflux, 25 g of concentrated sulfuric acid was additionally added, and the mixture was stirred for 10 hours. After completion of the reaction, the reaction mixture was poured into 10 l of distilled water and washed with 5 l of distilled water, and the resulting solid had a GPC purity of 87%. The terminology "GPC purity" as used herein means the purity of the objective measured by gel permission chromatography at a measurement wavelength of 282 nm. The solid was purified by column chromatography to obtain 80 g of Compound (II-1) as the objective (GPC purity: 97%).

Synthesis Example (17): Synthesis of Compound (II-4)

Into a four-necked flask equipped with a stirrer, a reflux condenser tube, a thermometer and a drip feeder, 70.5 g of terpene bis-o-cresol (produced by Yasuhara Chemical Co.), 182.3 g of a 25% aqueous TMAH solution and 100 ml of distilled water were charged and heated up to 40° C. to dissolve the terpene bis-o-cresol. To the mixed solution, 97.4 g of a 37% aqueous formalin solution was added dropwise over 30 minutes and the mixture was heated at 40° C. for 10 hours while stirring. To the reaction mixed solution, 100 ml of distilled water and 50 ml of hydrochloric acid were added to obtain brown solid. The brown solid obtained was purified by column chromatography to obtain 57.8 g of a bismethylol product of terpene bis-o-cresol (hereinafter Compound E) as white powder.

Then, into a three-necked flask equipped with a stirrer, a reflux condenser tube and a thermometer, 41.3 g of Compound E obtained above, 99.1 g of phenol and 400 ml of methanol were charged and heated up to 60° C. to dissolve Compound E. When the compound was completely dissolved, 1 g of concentrated sulfuric acid was added and the mixture was heated under reflux and stirred for 5 hours. The reaction mixed solution was crystallized in 4 l of distilled water and filtered, and the resulting yellow solid was purified by column chromatography to obtain 28.2 g of objective Compound (II-4) as white powder.

Synthesis Example (18): Synthesis of Photosensitive Material g

Into a three-necked flask, 65.7 g of Compound (II-1), 53.7 g of 1,2-naphthoquinonediazide-5-sulfonyl chloride and 900 ml of acetone were charged and uniformly dissolved. Then, 20.8 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried to obtain 104.5 g of 1,2-naphthoquinonediazide-5-sulfonic ester of Compound (II-1) (Photosensitive Material g).

In a high-performance liquid chromatography determined by means of a detector using ultraviolet rays of 254 nm, the diester form of Photosensitive Material g accounted for 44% of the entire pattern area.

Synthesis Example (19): Synthesis of Photosensitive Material h

To a three-necked flask, 56.4 g of Compound (II-4), 61.8 g of 1,2-naphthoquinonediazide-5-sulfonyl chloride and 750 ml of acetone were charged and uniformly dissolved. Then, triethylamine/acetone (=24.4 g/100 ml) was gradually added dropwise and reacted at 25° C. for 3 hours. The reaction mixed solution was poured into 3,000 ml of a 1% aqueous hydrochloric acid solution and the precipitate generated was separated by filtration, washed with water and dried (at 40° C.) to obtain 92.3 g of 1,2-naphthoquinonediazide-5-sulfonic ester of Compound (II-4) (Photosensitive Material h).

In a high-performance liquid chromatography determined by means of a detector using ultraviolet rays of 254 nm, the diester form of Photosensitive Material h accounted for 44% of the entire pattern area.

Preparation of Positive Photoresist Composition and Evaluation

Photosensitive Materials a, b, c, e, g, and h obtained in Synthesis Examples (6), (7), (8), and (10) of Example 1, and Synthesis Examples (18) and (19), Novolak Resins A to C obtained in Synthesis Examples (12) to (14) of Example 1, 22.8 g of ethyl lactate and a polyhydroxy compound (optionally) were mixed at a proportion shown in Table 3, and each solution was made uniform and filtered through a Teflon-made microfilter having a pore size of 0.10 μm to prepare photoresist compositions. Each photoresist composition was coated on a silicon wafer by means of a spinner while varying the revolution number, and the coating was dried on a vacuum adhesion type hot plate at 90° C. for 60 seconds to obtain a photoresist film having a film thickness of 0.76 μm or 0.78 μm.

Each film was exposed using a reduction projection exposure apparatus (reduction projection exposure apparatus NSR-2005i9C, manufactured by Nikon Corporation), subjected to PEB at 120° C. for 60 seconds, developed with a 2.38% aqueous solution of tetramethylammonium hydroxide for one minute, washed with water for 30 seconds and dried.

Each of the thus-obtained resist patterns on a silicon wafer was observed through a scanning electron microscope and the resists were evaluated. The results obtained are shown in Table 4.

The resolution shows a limiting resolution at an exposure amount necessary for producing a mask pattern of 0.50 μm.

The ratio of the resolution at a film thickness of 0.76 μm to the resolution at a film thickness of 0.78 μm was used as an index for the film thickness dependency. The value closer to 1.0 reveals that the film thickness dependency is advantageously smaller.

With respect to the standing wave, it was evaluated "A" when the standing wave was not observed on the side wall of a 0.40-μm line at the film thickness of 0.76 μm and "B" when the standing wave remained thereon.

TABLE 3

| | Photosensitive Material | | | | | | | |
|---|---|---|---|---|---|---|---|---|
| | Novolak Resin | | I | | II | | Polyhydroxy Compound | |
| Example | Kind | Addition Amount (g) | Kind | Addition Amount (g) | Kind | Addition Amount (g) | Kind | Addition Amount (g) |
| 17 | A | 90 | a | 12 | g | 18 | P-1 | 10 |
| 18 | B | 70 | a | 11 | g | 44 | P-1 | 30 |
| 19 | B | 67 | a | 18 | g | 42 | P-3 | 33 |
| 20 | B | 67 | a | 18 | g | 42 | P-4 | 33 |
| 21 | C | 75 | a | 6 | g | 54 | P-1 | 25 |
| 22 | B | 73 | a | 20 | h | 30 | P-1 | 27 |
| 23 | B | 75 | b | 13.5 | g | 31.5 | P-1 | 25 |
| 24 | B | 75 | c | 12 | g | 28 | P-1 | 25 |
| 25 | B | 70 | e | 11 | g | 44 | P-1 | 30 |
| 26 | B | 73 | a | 15 | g | 22.5 | P-1 | 27 |
| | | | | | h | 22.5 | | |
| 27 | A | 14 | a | 12 | g | 24 | P-1 | 30 |
| | B | 56 | | | h | 24 | | |
| 28 | B | 37 | a | 14 | g | 20.5 | P-1 | 13 |
| | C | 37 | | | h | 20.5 | P-3 | 13 |
| Reference Example 1 | B | 70 | a | 55 | | | P-1 | 30 |
| Comarative Example 4 | B | 70 | | | g | 55 | P-1 | 30 |

P-1, P-3 and P-4 are the same as those used in ExaMple 1.

TABLE 4

| | Resolution (μm) | Film Thickness Dependency | Standing Wave |
|---|---|---|---|
| Example 17 | 0.30 | 0.97 | A |
| 18 | 0.28 | 1.00 | A |
| 19 | 0.29 | 0.97 | A |
| 20 | 0.29 | 0.97 | A |
| 21 | 0.29 | 0.93 | A |
| 22 | 0.29 | 0.97 | A |
| 23 | 0.28 | 0.93 | A |
| 24 | 0.29 | 0.97 | A |
| 25 | 0.29 | 1.00 | A |
| 26 | 0.27 | 0.93 | A |
| 27 | 0.28 | 1.00 | A |
| 28 | 0.27 | 0.97 | A |
| Reference Example 1 | 0.35 | 0.97 | A |
| Comparative Example 4 | 0.31 | 0.85 | B |

With respect to Examples 17 to 28 and Reference Example 1, and Comparative Example 4, the sensitivity was evaluated and as a result, in Examples 17 to 28 and Reference Example 1, the sensitivity was good but in Comparative Example 4, the sensitivity as extremely reduced.

As is seen from this, the resists using two kinds of photosensitive materials exhibited good resolution, were reduced in the film thickness dependency of the resist performance and underwent no generation of standing wave.

According to the present invention, a positive photoresist composition for ultrafine working can be provided which exhibits high resolution and is improved with respect to the film thickness dependency and the standing wave, without causing any reduction in the sensitivity.

While the invention has been described in detail with reference to specific embodiments, it will be apparent to one skilled in the art that various changes and modifications can be made to the invention without departing from its spirit and scope.

What is claimed is:

1. A positive photoresist composition comprising an alkali-soluble resin and at least one of a 1,2-naphthoguinonediazide-5-sulfonic ester of a polyhydroxy compound or a 1,2-naphthoguinonediazide-4-sulfonic ester of a polyhydroxy compound represented by the following formula ($I_t$), wherein the tetraester component of the at least one 1,2-naphthoguinonediazide-5-sulfonic ester of a polyhydroxy compound or 1,2-naphthoguinonediazide-4-sulfonic ester of a polyhydroxy compound represented by formula ($I_t$) account for 50% or more of the entire pattern area determined by high-performance liquid chromatography using ultraviolet rays of 254 nm:

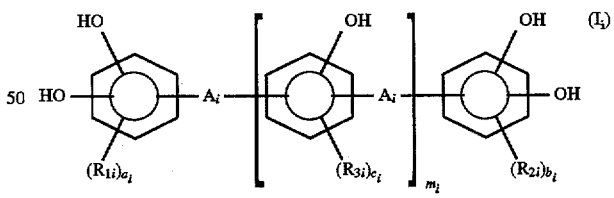

wherein $R_{1i}$, $R_{2i}$ and $R_{3i}$, which are the same or different, each represents a hydrogen atom, a halogen atom, an alkyl group, a cycloalkyl group, an alkoxy group, an aryl group or an alkenyl group;

the $A_i$ groups, which are the same or different, each represents a single bond, —O—, —S—, —SO—, —SO$_2$—, —CO—, —COO—,

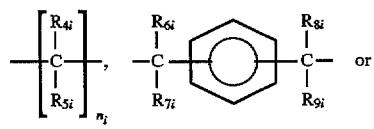

or

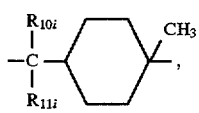

$R_{4i}$ and $R_{5i}$, which are the same or different, each represents a hydrogen atom or an alkyl group, provided that $R_{4i}$ and $R_{5i}$ may be combined to form a ring;

$R_{6i}$, $R_{7i}$, $R_{8i}$, $R_{9i}$, $R_{10i}$ and $R_{11i}$, which are the same or different, each represents a hydrogen atom or an alkyl group;

$a_i$, $b_i$ and $c_i$ each represents 0, 1, 2 or 3;

$m_i$ represents 2 or 3; and $n_i$ represents 1 or 2.

2. The positive photoresist composition of claim 1, wherein the polyhydroxy compound is represented by formula ($I_i$) where $R_{1i}$, $R_{2i}$ and $R_{3i}$ each represents a hydrogen atom, a halogen atom, an alkyl group having 1 to 4 carbon atoms, a cyclopentyl group, a cyclohexyl group, an alkoxy group having 1 to 4 carbon atoms, a phenyl group, a toluyl group, a xylyl group, a cumenyl group, a mesityl group, a vinyl group, a propenyl group, or an allyl group;

the $A_i$ groups each represents a single bond, —O—, —S—,

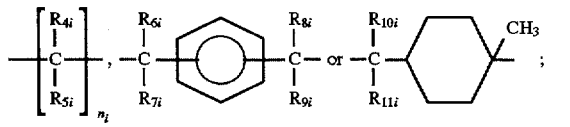

$R_{4i}$ and $R_{5i}$ each represents a hydrogen atom or an alkyl group having 1 to 4 carbon atoms, provided that $R_{4i}$ and $R_{5i}$ may be combined to form a ring; and $R_{6i}$, $R_{7i}$, $R_{8i}$, $R_{9i}$, $R_{10i}$ and $R_{11i}$ each represents a hydrogen atom or an alkyl group having 1 to 4 carbon atoms.

3. The positive photoresist composition of claim 1, wherein the content of said at least 1,2-naphthoquinonediazide-5-sulfonic ester of a polyhydroxy compound or 1,2-naphthoquinonediazide-4-sulfonic ester of a polyhydroxy compound represented by formula ($I_i$) is 5 to 100 parts by weight per 100 parts by weight of the alkali-soluble resin.

4. The positive photoresist composition of claim 1, wherein the alkali-soluble resin is selected from the group consisting of novolak resin, acetone-pyrogallol resin, polyhydroxystyrene and a derivative thereof.

5. A positive photoresist composition comprising an alkali-soluble resin, at least one of a 1,2-naphthoquinonediazide-5-sulfonic ester of a polyhydroxy compound or a 1,2-naphthoquinonediazide-4-sulfonic ester of a polyhydroxy compound represented by the following formula (I) and at least one of a 1,2-naphthoquinonediazide-5-sulfonic ester of a Polyhydroxy compound or a 1,2-naphthoquinonediazide-4-sulfonic ester of a polyhydroxy compound represented by the following formula (II):

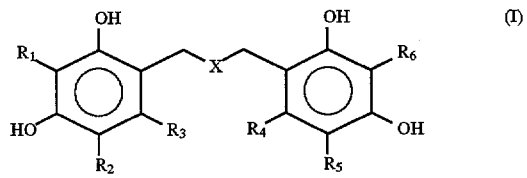

wherein X represents:

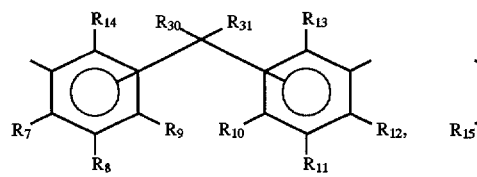
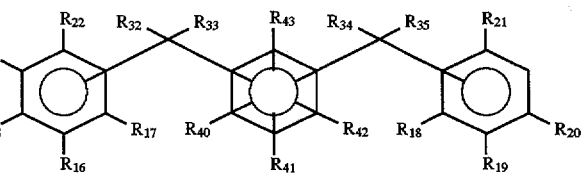

$R_1$ to $R_6$, which are the same or different, each represents a hydrogen atom, a halogen atom, an alkyl group having from 1 to 4 carbon atoms or an alkenyl group having from 2 to 5 carbon atoms;

$R_7$ to $R_{22}$, which are the same or different, each represents a hydrogen atom, a hydroxyl group, a halogen atom, an alkyl group having from 1 to 4 carbon atoms, an alkenyl group having from 2 to 5 carbon atoms or a cycloalkyl group;

$R_{30}$ to $R_{35}$, which are the same or different, each represents a hydrogen atom, or an alkyl group having from 1 to 4 carbon atoms, or $R_{30}$ and $R_{31}$, $R_{32}$ and $R_{33}$ or $R_{34}$ and $R_{35}$ are combined with each other to form a methylene chain having 4 or 5 carbon atoms so that a 5- or 6-membered ring is formed by the methylene chain and the carbon atom to which the combined two groups are bonded;

$R_{40}$ and $R_{41}$, which are the same or different, each represents a hydrogen atom, a halogen atom or an alkyl group having from 1 to 4 carbon atoms;

$R_{42}$ represents a hydrogen atom, a hydroxyl group or an alkyl group having from 1 to 4 carbon atoms; and $R_{43}$ represents a hydrogen atom, a halogen atom, an alkyl group having from 1 to 4 carbon atoms, an alkenyl group having from 2 to 5 carbon atoms, a cycloalkyl group, an aryl group or an alkoxy group;

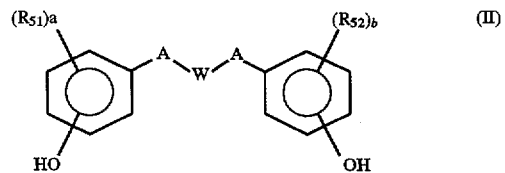

wherein $R_{51}$ and $R_{52}$, which are the same or different, each represents a hydrogen atom, a halogen atom, an alkyl group, an alkenyl group, an aryl group, an alkoxy group, an acyl group or a cycloalkyl group;

a and b each independently represents an integer of from 0 to 3;

A represents —C($R_{66}$) ($R_{67}$)—, —O—, —S—, —C(O=)—, —C(=O)O—, —S(=O)- or —S(=O)$_2$—, wherein $R_{66}$ and $R_{67}$, which are the same or different, each represents a hydrogen atom or an alkyl group;

W represents:

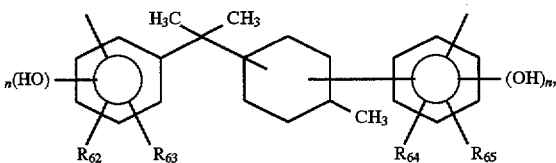

$R_{53}$ to $R_{65}$, which are the same or different, each represents a hydrogen atom, a halogen atom, an alkyl group, an alkenyl group, an aryl group, an alkoxy group or a cycloalkyl group;

$X_1$ and Y, which are the same or different, each represents a single bond or —C($R_{68}$) ($R_{69}$)—, wherein $R_{68}$ and $R_{69}$, which are the same or different, each represents a hydrogen atom or an alkyl group;

g represents an integer of from 0 to 3;

k represents 0 or 1; and n represents 1 or 2.

6. The positive photoresist composition of claim 5, wherein the ratio by weight of the ester of formula (I) to the ester of formula (II) is 5/95 to 60/40.

7. The positive photoresist composition of claim 5, wherein the total content of said at least one sulfonic ester of a polyhydroxy compound represented by formula (I) and said at least one sulfonic ester of a polyhydroxy compound represented by formula (II) is 5 to 100 parts by weight per 100 parts by weight of the alkali-soluble resin.

8. The positive photoresist composition of claim 5, wherein the alkali-soluble resin is selected from the group consisting of novolak resin, acetone-pyrogallol resin, polyhydroxystyrene and a derivative thereof.

* * * * *